United States Patent
Fasching et al.

(10) Patent No.: US 12,352,715 B2
(45) Date of Patent: Jul. 8, 2025

(54) METHODS AND SYSTEMS FOR IN-SITU IMPEDANCE SPECTROSCOPY ANALYSIS OF BATTERY CELLS IN MULTI-CELL BATTERY PACKS

(71) Applicant: Element Energy, Inc., Menlo Park, CA (US)

(72) Inventors: Rainer Johannes Fasching, Mill Valley, CA (US); Georgy Zerkalov, Santa Clara, CA (US); Arnaud Devie, Hawthorne, CA (US); Seth Marshall Kahn, San Francisco, CA (US); Anthony John Stratakos, San Anselmo, CA (US); Corrado Cammi, Sunnyvale, CA (US); Anderson Rennie John, Santa Clara, CA (US); Yoosok Saw, Seoul (KR)

(73) Assignee: Element Energy Inc., Menlo Park, CA (US)

(*) Notice: Subject to any disclaimer, the term of this patent is extended or adjusted under 35 U.S.C. 154(b) by 0 days.

(21) Appl. No.: 18/316,949

(22) Filed: May 12, 2023

(65) Prior Publication Data
US 2023/0280295 A1 Sep. 7, 2023

Related U.S. Application Data

(63) Continuation of application No. 17/401,784, filed on Aug. 13, 2021, now Pat. No. 11,692,956, which is a
(Continued)

(51) Int. Cl.
*G01N 27/02* (2006.01)
*G01R 31/382* (2019.01)
*G01R 31/392* (2019.01)

(52) U.S. Cl.
CPC ......... *G01N 27/026* (2013.01); *G01R 31/382* (2019.01); *G01R 31/392* (2019.01)

(58) Field of Classification Search
CPC ............... G01N 27/026; G01N 27/028; G01R 31/382; G01R 31/389; G01R 31/392; G01R 31/396
(Continued)

(56) References Cited

U.S. PATENT DOCUMENTS 6,332,113 B1    12/2001    Bertness
7,058,484 B1    6/2006    Potega
(Continued)

FOREIGN PATENT DOCUMENTS

CN      1864298 A    11/2006
CN      1758066 A    7/2009
(Continued)

OTHER PUBLICATIONS

German Application Serial No. 11-2021-004361.7, Office Action mailed May 19, 2023, 14 pgs.
(Continued)

*Primary Examiner* — Nasima Monsur
(74) *Attorney, Agent, or Firm* — Polygon IP, LLP

(57) ABSTRACT

Described methods and systems are used for in-situ impedance spectroscopy analysis of battery cells in multi-cell battery packs. Specifically, the cell impedances are determined while the pack continues to operate, such as being charged or discharged. For example, the pack voltage/power output remains unchanged while this analysis is initiated, performed, and ended. Cell impedance is determined based on the cell's response to the signal applied to the cell. For example, a current through the cell is charged while monitoring cells' voltage response. Although the power output of the changes during this testing, but the operation of the pack
(Continued)

is not impacted due to the power compensation provided by one or more other cells in the pack thereby ensuring uninterrupted operation of the pack. This in situ testing is provided by the unique architecture of the pack, comprising multiple nodes and individual node controllers.

18 Claims, 13 Drawing Sheets

Related U.S. Application Data continuation of application No. 16/996,422, filed on Aug. 18, 2020, now Pat. No. 11,125,707.

(58) Field of Classification Search
USPC ....... 324/426–427, 430, 525, 527, 600, 691, 324/649, 434, 425, 432
See application file for complete search history.

(56) References Cited

U.S. PATENT DOCUMENTS

| | | | |
|---|---|---|---|
| 7,332,881 B2 | 2/2008 | Clark et al. | |
| 7,560,882 B2 | 7/2009 | Clark et al. | |
| 7,675,293 B2* | 3/2010 | Christophersen | G01R 31/367 324/613 |
| 7,825,616 B2 | 11/2010 | Clark et al. | |
| 8,120,291 B2 | 2/2012 | Clark et al. | |
| 8,187,735 B2* | 5/2012 | Chiang | H01M 10/48 429/231.95 |
| 8,648,602 B2 | 2/2014 | Lammeren | |
| 8,686,693 B2 | 4/2014 | Bhowmik et al. | |
| 8,970,178 B2* | 3/2015 | Berkowitz | H01M 10/44 320/141 |
| 9,702,940 B2* | 7/2017 | Maluf | B60L 58/12 |
| 10,014,561 B2* | 7/2018 | Sood | G01N 29/07 |
| 10,067,198 B2* | 9/2018 | Maluf | H02J 7/0048 |
| 10,074,996 B2* | 9/2018 | Stefanopoulou | G01R 31/387 |
| 10,209,314 B2* | 2/2019 | Garcia | G01R 31/392 |
| 10,283,974 B2 | 5/2019 | Macris | |
| 10,300,798 B2 | 5/2019 | Paryani | |
| 10,302,703 B2 | 5/2019 | Fleischer et al. | |
| 10,379,168 B2 | 8/2019 | Christophersen et al. | |
| 10,422,835 B2 | 9/2019 | Kani et al. | |
| 10,434,890 B2 | 10/2019 | Uchida | |
| 10,673,101 B2* | 6/2020 | Sood | G01N 29/22 |
| 10,901,044 B2 | 1/2021 | Christophersen et al. | |
| 11,013,569 B2* | 5/2021 | Shelton, IV | A61B 90/53 |
| 11,054,481 B2* | 7/2021 | Christophersen | G01R 31/389 |
| 11,091,055 B2* | 8/2021 | Tarchinski | B60L 55/00 |
| 11,125,707 B1 | 9/2021 | Fasching | H01M 10/48 |
| 11,131,717 B1* | 9/2021 | Fasching | H02J 7/0048 |
| 11,422,102 B2* | 8/2022 | Christophersen | G01R 31/385 |
| 11,579,206 B2* | 2/2023 | Nicklaus | H02J 7/0044 |
| 11,692,956 B2* | 7/2023 | Fasching | G01R 31/389 324/691 |
| 11,698,416 B2* | 7/2023 | Fasching | G01R 31/396 429/90 |
| 11,831,192 B2* | 11/2023 | Kahn | G01R 31/385 |
| 2006/0078788 A1* | 4/2006 | Ramschak | H01M 8/04671 429/431 |
| 2009/0104510 A1* | 4/2009 | Fulop | H01M 50/553 429/50 |
| 2009/0208821 A1 | 8/2009 | Kosugi et al. | |
| 2010/0090651 A1* | 4/2010 | Sahu | H01M 8/188 320/132 |
| 2011/0077879 A1* | 3/2011 | Paryani | H02J 7/0071 320/162 |
| 2011/0151324 A1* | 6/2011 | Chiang | H01G 11/28 29/623.1 |
| 2011/0316548 A1* | 12/2011 | Ghantous | H01M 50/569 324/427 |
| 2012/0119746 A1* | 5/2012 | Macris | H02J 7/0013 324/431 |
| 2012/0200266 A1* | 8/2012 | Berkowitz | H01M 10/44 320/139 |
| 2012/0306504 A1* | 12/2012 | van Lammeren | G01R 31/396 324/426 |
| 2012/0310562 A1* | 12/2012 | van Lammeren | G01R 31/389 702/63 |
| 2012/0310565 A1 | 12/2012 | Redey | |
| 2013/0030596 A1 | 1/2013 | Okada et al. | |
| 2013/0030737 A1 | 1/2013 | Okada | |
| 2013/0141109 A1 | 6/2013 | Love et al. | |
| 2013/0154548 A1* | 6/2013 | Berkowitz | G01R 31/3835 320/128 |
| 2013/0241494 A1* | 9/2013 | Bhardwaj | H02J 7/00 320/129 |
| 2013/0253862 A1 | 9/2013 | Luo et al. | |
| 2013/0314049 A1 | 11/2013 | Van et al. | |
| 2014/0021959 A1* | 1/2014 | Maluf | H02J 7/0048 324/426 |
| 2014/0077765 A1* | 3/2014 | Gao | H02J 7/0016 320/126 |
| 2014/0152315 A1 | 6/2014 | Leport et al. | |
| 2014/0199569 A1 | 7/2014 | Sisk | |
| 2014/0312912 A1* | 10/2014 | Berkowitz | G01R 31/388 324/426 |
| 2014/0358462 A1 | 12/2014 | Christophersen et al. | |
| 2015/0153417 A1* | 6/2015 | Maluf | G01R 31/382 324/426 |
| 2015/0165921 A1 | 6/2015 | Paryani et al. | |
| 2015/0219722 A1* | 8/2015 | Maluf | H02J 7/00711 324/426 |
| 2015/0377976 A1* | 12/2015 | Maluf | G01R 31/392 702/63 |
| 2016/0084917 A1 | 3/2016 | Nam | |
| 2016/0103186 A1 | 4/2016 | Hong et al. | |
| 2016/0146895 A1* | 5/2016 | Yazami | H01M 10/486 324/426 |
| 2016/0178703 A1 | 6/2016 | Hwang et al. | |
| 2016/0190833 A1 | 6/2016 | Roumi et al. | |
| 2016/0197382 A1* | 7/2016 | Sood | B60L 58/16 73/620 |
| 2018/0056809 A1 | 3/2018 | Uchida et al. | |
| 2018/0196107 A1 | 7/2018 | Fleischer et al. | |
| 2018/0287219 A1* | 10/2018 | Sood | H01M 10/0525 |
| 2018/0337536 A1 | 11/2018 | Li et al. | |
| 2019/0064284 A1 | 2/2019 | Christophersen et al. | |
| 2019/0111800 A1* | 4/2019 | Remboski | G01R 31/3648 |
| 2019/0120910 A1* | 4/2019 | Ghantous | H02J 7/0047 |
| 2019/0283617 A1 | 9/2019 | Paryani | |
| 2019/0302863 A1* | 10/2019 | Chandra | G06F 1/329 |
| 2019/0310215 A1 | 10/2019 | Ballantine et al. | |
| 2019/0312317 A1 | 10/2019 | Unknown | |
| 2019/0317152 A1 | 10/2019 | Ballantine et al. | |
| 2020/0153264 A1 | 5/2020 | Osada et al. | |
| 2020/0176829 A1* | 6/2020 | Nishikawa | H01M 10/441 |
| 2020/0203961 A1 | 6/2020 | Flowers et al. | |
| 2020/0256924 A1 | 8/2020 | Hoermaier et al. | |
| 2020/0300920 A1* | 9/2020 | Christophersen | H01M 10/48 |
| 2020/0353839 A1* | 11/2020 | Tarchinski | B60L 58/12 |
| 2020/0405425 A1* | 12/2020 | Shelton, IV | A61B 34/20 |
| 2021/0148987 A1* | 5/2021 | Ghantous | H02J 7/0047 |
| 2021/0188093 A1* | 6/2021 | Gyani | B60L 50/64 |
| 2021/0215628 A1* | 7/2021 | Christophersen | G01R 31/392 |
| 2021/0255248 A1* | 8/2021 | Christophersen | G01R 31/389 |
| 2022/0057350 A1* | 2/2022 | Fasching | G01R 31/389 |
| 2022/0057453 A1* | 2/2022 | Nicklaus | H02J 7/00034 |
| 2022/0057455 A1* | 2/2022 | Fasching | H02J 7/0048 |
| 2022/0397541 A1* | 12/2022 | Christophersen | G01N 27/416 |
| 2023/0280295 A1* | 9/2023 | Fasching | H01M 10/425 324/691 |
| 2023/0280412 A1* | 9/2023 | Fasching | G01R 31/396 429/90 |
| 2023/0375491 A1* | 11/2023 | Christophersen | G01N 27/416 |

FOREIGN PATENT DOCUMENTS

| | | |
|---|---|---|
| CN | 102859378 A | 1/2013 |
| CN | 102246385 A | 7/2015 |

(56) References Cited

FOREIGN PATENT DOCUMENTS

| CN | 105264709 | A |   | 5/2018  |            |
|----|-----------|---|---|---------|------------|
| CN | 114859258 | B | * | 12/2020 |            |
| CN | 114859258 | A |   | 8/2022  |            |
| CN | 115267584 | A | * | 11/2022 |            |
| CN | 110892606 | A |   | 7/2023  |            |
| CN | 116420084 | A |   | 7/2023  |            |
| CN | 116420084 | B |   | 6/2024  |            |
| DE | 102013214821 | A1 |   | 2/2015  |          |
| DE | 102017218588 | A1 |   | 4/2019  |          |
| JP | 3769111 | B2 | * | 4/2006 | G01R 31/3662 |
| WO | WO-2012135148 | A1 | * | 10/2012 | B60L 58/12 |
| WO | WO-2020190508 | A1 | * | 9/2020 | G01R 31/3648 |
| WO | WO-2021239894 | A1 | * | 12/2021 | B60L 3/12 |
| WO | WO-2022040034 | A1 | * | 2/2022 | G01N 27/026 |
| WO | WO-2022040036 | A1 | * | 2/2022 | G01R 31/396 |

OTHER PUBLICATIONS

Chinese Application No. 2021800695691, Notice of Allowance mailed May 6, 2024, 5 pgs.

U.S. Appl. No. 16/996,422, Advisory Action mailed Apr. 27, 2021, 3 pgs.

U.S. Appl. No. 16/996,422, Final Office Action mailed Jan. 28, 2021, 13 pgs.

U.S. Appl. No. 16/996,422, Non-Final Rejection, Nov. 24, 2020, 11 pgs.

U.S. Appl. No. 16/996,422, Notice of Allowance mailed May 19, 2021, 11 pgs.

U.S. Appl. No. 17/401,784, Non Final Office Action mailed Sep. 20, 2022, 19 pgs.

U.S. Appl. No. 17/401,784, Non Final Office Action mailed Sep. 22, 2022, 19 pgs.

* cited by examiner

METHODS AND SYSTEMS FOR IN-SITU IMPEDANCE SPECTROSCOPY ANALYSIS OF BATTERY CELLS IN MULTI-CELL BATTERY PACKS

CROSS-REFERENCE TO RELATED APPLICATIONS

This application is a continuation of U.S. patent application Ser. No. 17/401,784, filed on 2021 Aug. 13, which is a continuation of U.S. patent application Ser. No. 16/996,422, filed on 2020 Aug. 18 and issued as U.S. Pat. No. 11,125,707 on 2021 Sep. 21, all of which are incorporated herein by reference in their entirety for all purposes.

BACKGROUND

Multi-cell battery packs are used for various applications. While battery cells, forming a pack, typically have the same design, these cells may exhibit some differences in performance characteristics, such as impedance. Conventional designs and controls of battery packs typically do not allow in-situ impedance monitoring. Furthermore, these designs and controls may limit the overall pack performance to accommodate for potential impedance variations. At the same time, cell impedance can be used to determine the state of charge (SOC), state of power (SOP), state of health (SOH), and state of safety (SOS). In some examples, cell impedance can be used to determine the remaining useful life of the cell. Furthermore, the impedance increase can be used as early indications of potentially weak and/or unsafe cells.

For example, conventional battery management systems (BMS) strive to keep the state of charge among different cells at the same level, which may be referred to as cell balancing. Typically, such circuits include electrical switches and current diversion components, such as resistors, capacitors, and/or inductors. For example, a resistor may be intermittently connected in parallel with a battery cell, to bypass a current excess through this resistor. This bypass current is used to reduce the charge/discharge rate of a cell. However, these conventional systems have limited functionality, cause power losses, and are not able to fully address the above-mentioned variations in cells resulting in reduced performance characteristics of battery cells. Another deficiency of conventional BMS is that these BMS are not capable of identifying unsafe cells or, more specifically, identify specific degradation modes of cells (e.g., based on impedance testing results). Finally, bringing an off-line cell back online is challenging and typically requires SOC balancing with other cells, which is also beyond the capabilities of conventional BMS.

What is needed are novel methods and systems for in-situ impedance spectroscopy of battery cells in multi-cell battery packs.

SUMMARY

Described methods and systems are used for in-situ impedance spectroscopy analysis of battery cells in multi-cell battery packs. Specifically, the cell impedances are determined while the pack continues to operate, such as being charged or discharged. For example, the pack voltage/power output remains unchanged while this analysis is initiated, performed, and ended. Cell impedance is determined based on the cell's response to the signal applied to the cell. For example, a current through the cell is charged while monitoring cells' voltage response. Although the power output of the changes during this testing, but the operation of the pack is not impacted due to the power compensation provided by one or more other cells in the pack thereby ensuring uninterrupted operation of the pack. This in situ testing is provided by the unique architecture of the pack, comprising multiple nodes and individual node controllers.

In some examples, a method for an in-situ impedance spectroscopy analysis of battery cells in a battery pack is provided. The method comprises applying a signal to a first battery cell of a first battery node of the battery pack while the battery pack remains operational and provides power output. The method also comprises determining an impedance of the first battery cell based on a response of the first battery cell to the signal applied to the first battery cell.

In some examples, a cell battery pack comprises a first battery node, comprising a first node controller and a first battery cell, electrically coupled to the first node controller. The first node controller is configured to apply a signal to the first battery cell while the battery pack remains operational and providing power output. The cell battery pack also comprises a second battery node, comprising a second node controller and a second battery cell, electrically coupled to the second node controller. The cell battery pack also comprises a bus, electrically interconnecting the first node controller and the second node controller, and a battery pack controller, communicatively coupled to the first node controller and the second node controller. At least one of the first node controller or the battery pack controller is configured to determine an impedance of the first battery cell based on a response of the first battery cell to the signal applied to the first battery cell.

DETAILED DESCRIPTION

Figure 1A:
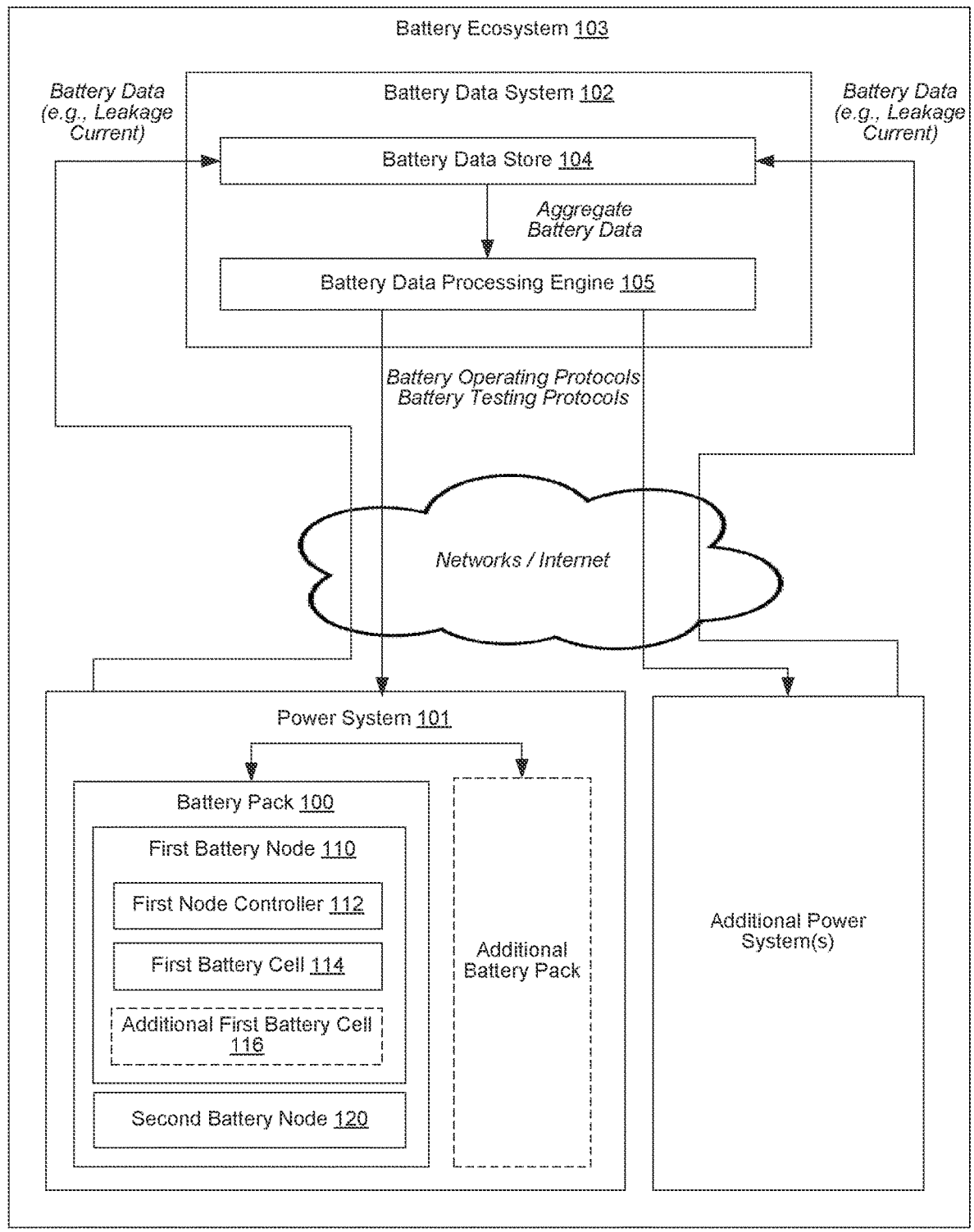
FIG. 1A is a schematic block diagram of a battery ecosystem, used for collecting and analyzing battery data from multiple power systems and developing new battery operating procedures and/or new battery testing protocols for these power systems, in accordance with some examples.

In the following description, numerous specific details are set forth in order to provide a thorough understanding of the presented concepts. In some examples, the presented concepts are practiced without some or all of these specific details. In other instances, well-known process operations have not been described in detail to not unnecessarily obscure the described concepts. While some concepts will be described in conjunction with the specific examples, it will be understood that these examples are not intended to be limiting.

INTRODUCTION

Cell impedance provides important information about the current state of the battery cell. For example, cell impedance may be used to determine cells' SOC, SOP, SOH, and SOS. In some examples, cell impedance may be used to improve operating characteristics of the cell (e.g., cutoff voltages, charge/discharge current) to maximize the overall cell performance (e.g., operating capacity, cycle life, and others). Impedance is a combination of resistance and reactance when a variable current is applied to the cell. This variable current is sometimes referred to as an alternating current (AC) stimulus. However, the variable current does not need to change phase. Instead, the current passing through the cell may change its amplitude at a certain frequency, sufficient to observe the reactance component of the impedance. Furthermore, the resistance of a battery cell is a combination of electrical resistance and ionic resistance. For example, the ionic resistance depends on the electrodes' surface areas and the electrolyte ionic conductivity. Overall, the impedance of a battery cell depends on many factors, such as overall design (e.g., materials used for various components, structural features such as thicknesses, arrangements, interconnections, etc.), assembly variations, previous operations, and other similar factors.

Many conventional methods used for measuring cell impedance do not apply to conventional battery packs. Specifically, these methods are not applicable for measuring the impedance of battery cells or, more specifically, measuring the impedance of individual battery cells while the battery packs are in use, which may be referred to as in-situ measurement or in-situ spectroscopy. For example, in conventional battery packs, battery cells are permanently connected in series, e.g., to increase the voltage collectively provided by these battery cells. Even when dedicated voltage leads are provided to cells, the permanent primary connections will interfere with impedance testing when the battery pack is in operation and the same current passes through all cells connected in series. In-situ impedance spectroscopy testing of cells in such battery packs is not possible. As a result, to avoid potential safety issues, many conventional packs are operated significantly below their capabilities.

Methods and systems described herein are specifically designed and configured to perform in-situ impedance spectroscopy analysis of cells in multi-cell battery packs. The in-situ feature indicates that impedance can be determined even when the battery pack is in operation, e.g., charging or discharging. In-situ testing should be distinguished from offline testing, e.g., when the entire battery pack is taken offline and is not used. In some examples, the in-situ testing is performed without any changes to the overall pack operation (e.g., to the pack voltage and/or to the pack power output). Specifically, during the in-situ impedance testing, the current through one or more cells may change while monitoring the voltage response and while the pack continues to operate and support any external power demands, characterized by the pack's charging or discharging. The power contributions of these tested cells (to the overall pack power output) may be compensated by one or more other cells in the pack. These other cells are operated per specific power compensation profiles, which may be also referred to as a voltage compensation profile. As a result, the battery pack continues to operate without any disruptions (e.g., providing the same level of power, at the same voltage and current). It should be noted that the power, voltage, and/or current of the battery pack may change while performing in-situ impedance testing, e.g., based on different power demands from the battery pack. However, these changes are driven by the application requirement of the battery pack (e.g., power demands) rather than by in-situ impedance testing. It also should be noted that taking one or more cells offline (for testing) and then bringing these cells back online (after completing the testing) does not impact the overall operation of the battery pack. Overall, the methods and systems described herein can provide real-time and on-demand impedance feedback from individual cells, while continuously operating the packs. In other words, the pack power output, current, and voltage remain substantially unchanged during this test. In some examples, the variations of these parameters are less than 5% or even less than 2% when initiating the in-situ impedance spectroscopy.

It should be noted that even though the power output (of a tested cell) changes during the impedance test of this cell, this change is compensated by one or more other cells in the battery pack (e.g., all remaining cells in specific examples). Furthermore, in some examples, this compensation by other cells is also used for impedance testing of these other cells. For example, a current passing through one tested cell may be increased while a current passing through another cell may be decreased at the same time. One having ordinary skill in the art would understand how to scale this example to test a larger number of cells, e.g., increasing currents through a first plurality of cells while simultaneously decreasing through a second plurality of cells in the same power pack. Finally, this real-time impedance feedback is used, e.g., to dynamically update the operating parameters of the cells (e.g., charge/discharge rates, cutoff voltages), again on the individual cell level.

While various references are made to "power output" of a battery pack/cell, one having ordinary skill in the art would understand that this term encompasses both the power supplied and the power received by the battery pack/cell. For example, in-situ impedance spectroscopy analysis may be performed while charging or while discharging the battery cell. Furthermore, the overall operation continuity during cell testing may be expressed in terms of the pack voltage, which remains substantially the same while changing the current through one or more battery cells.

These novel in-situ testing functions of multi-cell battery packs are enabled by a specific pack architecture, in which multiple nodes are connected in series. Each node comprises one or more battery cells and a node controller, connected to one or more battery cells at this node and controlling operation and connections of these cells to the rest of the battery pack. Specifically, the node controller comprises one or more switches, which control connections to one or more cells at this node and can change these connections without disturbing the overall pack operation. For example, these switches may disconnect a cell or a set of cells from other cells in the pack and/or in the node. Furthermore, these switches may be used to bypass the node or, more specifically, all cells in the node. In some examples, a node controller comprises a voltage meter to measure a voltage of the cell or a set of cells (e.g., under changing current through the cells). The cells may have voltage leads connecting these cells (e.g., individually or as a set) to a voltage meter. These voltages leads and connections to other sensors should be differentiated from electrical power connections to the cells, which results in external current flowing through the cell. In more specific examples, if a set of multiple cells are being connected/disconnected by a single switch, each cell in this set may have a dedicated set of voltage leads, allowing independent monitoring of the voltage across this cell.

Multiple nodes of the battery pack are connected in series. However, other types of connections are also within the scope. Individual node controllers, one at each node, provide controllable connections to and operations of one or more batteries at each node. More specifically, each node controller controls a signal applied to one or more battery cells during an in-situ impedance spectroscopy analysis. One example of this signal is changing an electrical current through one or more tested battery cells at the node. In some examples, a node controller is configured to independently initiate and perform the impedance spectroscopy analysis of the cells in the corresponding node. Alternatively, the node controller receives instructions from a battery pack controller, which is communicatively coupled to other node controllers in the battery pack. For example, the battery pack controller may instruct the node controller to apply a signal to one or more cells, e.g., switch operation of these cells from a standard operation to a test profile, The signal or test profile is specifically designed to measure the impedance of this cell. Furthermore, the battery pack controller may instruct the same node controller or a different node controller to switch the operation of another cell to another profile, specifically designed to fully or partially compensate for power output changes associated with the tested battery cell. This other profile may be referred to as a compensation profile (e.g., a power compensation profile). In more specific examples, various cell data may be collected from one or more battery cells operated per corresponding compensation profiles, in which case these compensation profiles may be referred to as test profiles or additional test profiles.

As noted above, multiple battery nodes are connected in series, to boost the overall pack voltage. Furthermore, these multiple battery nodes collectively provide total power output for the battery pack. However, individual contributions to this total power output by each battery node are controlled, to some extent (limited by current battery characteristics at each node), by the battery pack controller. The battery controller controls a node controller at each battery node, collectively controlling the current passing through each battery cell at each node and collecting cell data (e.g., voltage) from one or more cells. It should be noted that the node voltage is controlled by the node controller of this node, and this node voltage, in some examples, is different from the cell voltage (e.g., when the node comprises only one cell) or a voltage produced by all cells of that node. Furthermore, the node controller can change the cell current of one or more cells at this node, which triggers the change in cell voltage. For example, a portion of the current passing through the node is bypassed through the node controller. Changes to the cell current are performed without changing the current passing through the node. The node current is the same for every node due to the in-series connection.

Operating modes of individual cells or sets of cells may vary at any time. Furthermore, different cells may be operated differently. Finally, these operating changes may be implemented at the cell level without any changes to the overall power output of the battery pack. These features allow using battery cells with different characteristics (e.g., different aging levels, different capacities, different impedances, etc.) in the same battery pack. Furthermore, a battery pack may be used longer even though some cells may experience significant degradation and, in extreme cases, one or more cells may be completely taken offline and not contribute to the pack power output. Overall, these features allow achieving much greater and longer performance of multi-cell battery packs.

As noted above, in-situ impedance spectroscopy analysis is performed when a signal is applied to a battery cell or, more specifically, when this battery cell is operated according to a specific test profile using a corresponding node controller (e.g., based on instructions supplied from a battery pack controller). In some examples, the test profile comprises one or more changes to the electrical current passing through the cell, such as a linear change, step change, sinusoidal wave, square wave, and others. Also, various frequencies for these changes are within the scope. In some examples, opposite phases for two battery cells in a battery pack are used to maintain the combined power output at the same level. Specifically, as the electrical current passing through one cell is decreased, the current passing through the other cell is increased, e.g., by the same amount. This may be referred to as one-to-one matching. In some examples, multiple cells are used to compensate for the changes in one cell, which may be referred to as one-to-many matching. These examples may be used, for example, when one cell is taken completely offline, i.e., no current is passed through the cell or when a very little current is passed through the cell. Furthermore, the one-to-many matching may be used when a high charge/discharge load is applied to the battery pack.

Battery Ecosystem Examples

As noted above, multiple battery cells are often assembled into a battery pack to provide higher power output and/or higher energy storage capacity. Battery packs, in turn, are often used as parts of various higher-level power systems, such as electric vehicles, stationary energy storage systems, grid energy storage, and others. In some examples, one power system comprises multiple battery packs.

Many modern power systems have communication capabilities for receiving and sharing information. In some examples, these communication capabilities are used for receiving and sharing information related to battery pack operation or, more specifically, to the operation and testing of cells assembled into the packs. Some examples of this information include, but are not limited to, impedance testing results, impedance testing protocols, power compensation profiles, cell operating profiles, and others. This information may be collectively referred to as battery data.

In some examples, the battery data (from multiple different power systems) is aggregated to perform data analysis for multiple different battery cells, multiple different power packs, and/or multiple different power systems. The aggregate data analysis has multiple additional benefits in comparison, e.g., to the data analysis of an individual cell. For example, an aggregate data analysis may involve data from cells having different cycle lives, which provides various insights into cell aging (e.g., changing in impedance over the operating lifetime). In another example, an aggregate data analysis may involve data from cells operated using different parameters (e.g., charge rates, cutoff voltages, temperatures), which provides insights into the effects of these operating parameters on the SOH of the cells. Other examples of aggregate data analysis are also within the scope. In general, information about one set of battery cells (and battery packs formed from these cells) may be relevant for another set of battery cells. For example, battery cells in both sets may be of the same type. Aggregating battery data across multiple battery packs and power systems allow having sufficient amounts and sufficiently diverse data for training various machine learning algorithms, e.g., to more precisely identify and respond to various data points such as subtle outliers.

Overall, aggregate battery data and aggregate data analysis may be used to develop new operating protocols, new test protocols, new battery cell and/or pack designs, and others. For purposes of this disclosure, the sharing of battery data among different power systems is performed within a battery ecosystem. A battery ecosystem may be managed by a manufacturer of power systems (e.g., electric vehicles), a consortium of different manufacturers, a third party, and others.

FIG. 1A is a schematic illustration of battery ecosystem 103, in accordance with some examples. Battery ecosystem 103 comprises power system 101 and, optionally, one or more additional power systems. Each of these power systems comprises at least one battery pack. For example, FIG. 1A illustrates power system 101 comprising battery pack 100 and an optional additional battery pack. Any number of packs in a power system and any number of power systems within a battery ecosystem are within the scope. Battery pack 100 comprises multiple battery nodes, such as first battery node 110 and second battery node 120, as further described below with reference to FIG. 1B.

Battery ecosystem 103 also comprises battery data system 102, which is communicatively coupled (e.g., via various networks and/or internet) to each of the power systems, such as power system 101. Battery data system 102 comprises battery data store 104 and battery data processing engine 105. Battery data store 104 is configured to receive battery data (e.g., results of impedance testing) from various power systems and store this battery data. This battery data, in battery data store 104, may be referred to as aggregate battery data. In some examples, this aggregate battery data comprises individual cell data (e.g., results of impedance testing). In more specific examples, this aggregate battery data also comprises pack level data and/or power system-level data.

Battery data store 104 also provides this aggregate battery data to battery data processing engine 105 for various types of analysis, such as deterministic analysis, outlier detection, classification, linear regression, forecasting histogram generation, and others. In some examples, battery data processing engine 105 comprises a self-learning module.

In some examples, battery data processing engine 105 is configured to generate/revise battery operating protocols and/or battery testing protocols, as further described below with reference to FIG. 2A. For example, battery data processing engine 105 may revise a previously-used battery operating protocol based on the results of a recent impedance testing.

In some examples, these battery operating protocols and battery testing protocols are transmitted to various power systems and used by the power systems for operating and testing batteries, e.g., determining impedance describe below with reference to FIG. 2B.

Battery Pack Examples

Figure 1B:
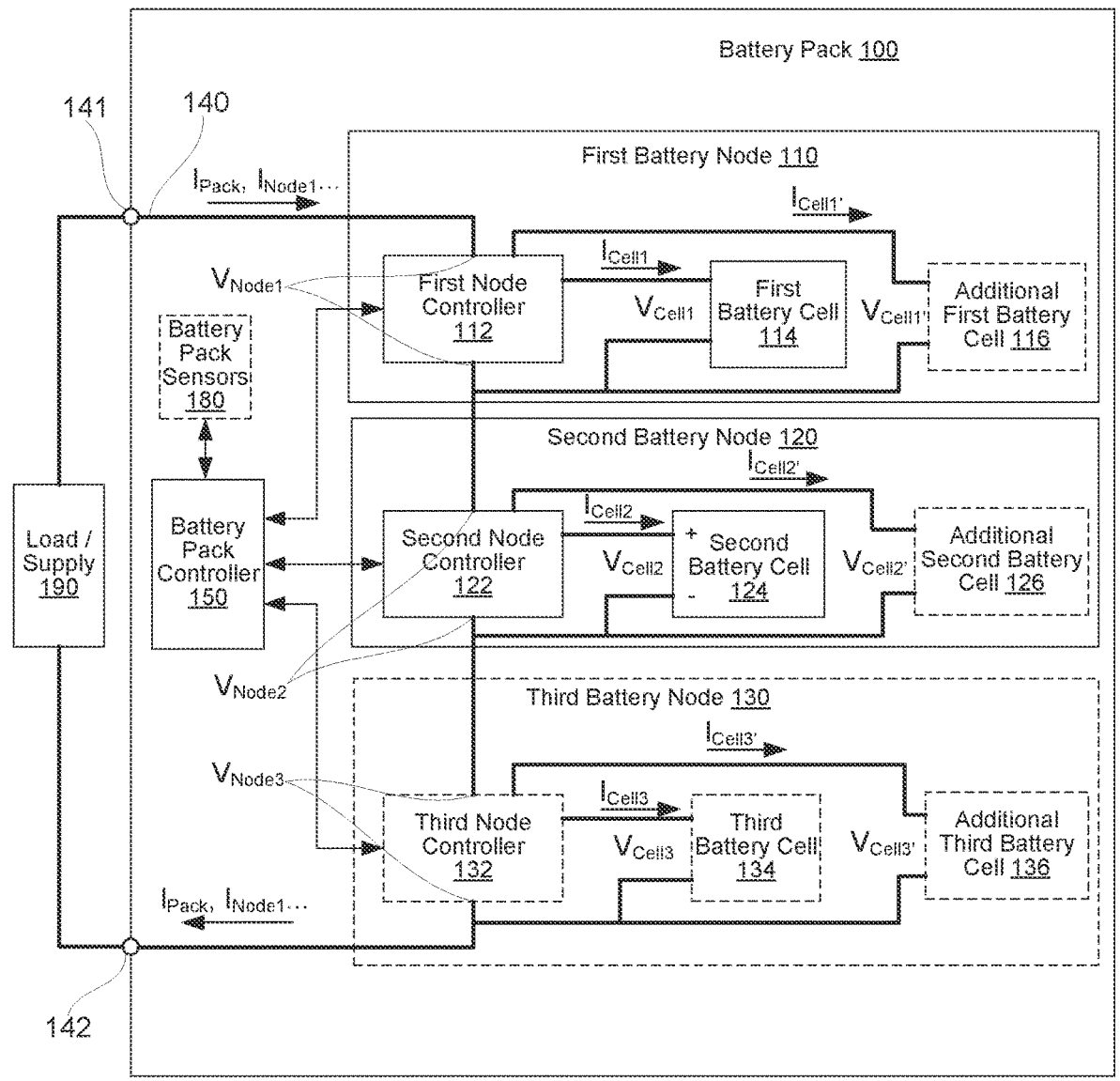
FIG. 1B is a schematic illustration of a battery pack, comprising multiple battery nodes, interconnected in series and comprising multiple battery cells, in accordance with some examples.

FIG. 1B is a schematic illustration of battery pack 100, configured for an in-situ impedance spectroscopy analysis of battery cells in battery pack 100, in accordance with some examples. Battery pack 100 comprises at least two battery nodes, e.g., first battery node 110 and second battery node 120, and each battery node comprises at least one cell. As such, battery pack 100 may be also referred to as a multi-cell battery pack. In some examples, battery pack 100 comprises one or more additional battery nodes, such as third battery node 130 shown in FIG. 1A. However, these additional battery nodes are optional. References will be made primarily to first battery node 110 and second battery node 120. However, one having ordinary skill in the art would appreciate how various described features apply to battery pack 100 with more battery nodes.

Each of the battery nodes comprises a node controller and at least one battery cell. Referring to FIG. 1B, first battery node 110 comprises first node controller 112 and first battery cell 114, connected to and controlled by first node controller 112. Similarly, second battery node 120 comprises second node controller 122 and second battery cell 124, connected to and controlled by second node controller 122. Finally, third battery node 130, when present, comprises third node controller 132 and third battery cell 134, connected to and controlled by third node controller 132. Second node controller 122 and third node controller 132 may be referred to as additional node controllers of battery pack 100. First node controller 112 is connected in series (shown) and/or parallel with these additional node controllers.

Referring to FIG. 1B, in some examples, at least one battery node comprises one or more additional batteries, which are optional. For example, FIG. 1B illustrates first battery node 110 also comprising additional first battery cell 116, independently connected to and controlled by first node controller 112. More specifically, first node controller 112 controls first battery cell 114 and additional first battery cell 116, independently from each other. Similarly, second battery node 120 comprises additional second battery cell 126, also connected to and controlled by second node controller 122, independently from second battery cell 124. While FIG. 1B illustrates two battery cells in each of first battery node 110 and second battery node 120, each battery node can have any number of battery cells, e.g., one, two, three, four, or more. The number of battery cells per node is determined by the control capability of the node controller and, in some examples, the power ratings of the node controller (e.g., when the node controller comprises a power converter) and/or the power ratings of the cells at this node. Finally, FIG. 1B also illustrates third battery node 130, comprising additional third battery cell 136, also connected to and controlled by third node controller 132, independently from third battery cell 134. As noted above, third battery node 130 is optional. Furthermore, if third battery node 130 is present, third battery node 130 may include any number of battery cells.

Referring to FIG. 1B, the battery nodes are connected in series by bus 140. More specifically, the battery nodes are connected in series by bus 140. As such, first node controller 112 is connected in series with second node controller 122 and, if present, with third node controller 132. The ends of bus 140 are coupled to or form battery pack terminals, such as first battery pack terminal 141 and second battery pack terminal 142. During the operation of battery pack 100, load/supply 190 is connected to the battery pack terminals to supply power to battery pack 100 and/or to receive power from battery pack 100. A direct current (DC) is used for this power transmission.

Referring to FIG. 1B, battery pack 100 also comprises battery pack controller 150, which is communicative coupled to each node controller. Battery pack controller 150 controls the operation of each node controller, which in turn controls the operation of each battery cell or sets of battery cells with the node. For example, battery pack controller 150 instructs first node controller 112 to apply a signal to first battery cell 114 or, more specifically, to operate first battery cell 114 according to a test profile. This signal/test profile is specifically selected to measure the impedance of first battery cell 114. Battery pack controller 150 also receives a response (to the applied signal) of first battery cell 114, such as voltage and current profiles of first battery cell 114. The response is received from first node controller 112 and is used, by battery pack controller 150, to determine the impedance of first battery cell 114 as further described below. In some examples, the impedance of first battery cell 114 is determined by first node controller 112 and transmitted to battery pack controller 150.

Battery pack controller 150 is also configured to maintain the power output of battery pack 100 such that this power output and/or the pack voltage is not impacted by impedance testing. For example, when first node controller 112 applied a signal to first battery cell 114 (e.g., starts operating first battery cell 114 according to a first test profile), battery pack controller 150 may also instruct second node controller 122 to start operating second battery cell 124 according to a power compensation profile. This power compensation profile may be referred to a second test profile. The second test profile is designed to compensate for power output changes associated with the testing of first battery cell 114. If second battery cell 124 is the only cell used for this power compensation, then the second test profile is complimentary (and inverse) of the first test profile. Alternatively, multiple cells are used for this power compensation. More generally, battery pack controller 150 is configured to select one or more cells for this power compensation, e.g., based on the pack total power output, the SOC of each battery cell, power-control capabilities of each node controller, and other such factors. Additional features of battery pack controller 150 are described below with reference to FIG. 1E. In some examples, the power compensation may be also referred to as voltage compensation. For example, when testing of first battery cell 114 is initiated (e.g., by changing the current through first battery cell 114, the voltage of battery pack 100 remains substantially unchanged. Furthermore, while this disclosure primarily focuses on determining the impedance based on changing the current through a tested cell 114 and monitoring the voltage response of the tested cell, other techniques for determining the impedance are within the scope.

Referring to FIG. 1B, in some examples, battery pack 100 also comprises battery pack sensors 180, communicatively coupled to battery pack controller 150. Some examples of battery pack sensors 180 include but are not limited to one or more thermocouples (e.g., thermally coupled to individual battery cells), Hall effect sensors, voltage probes (e.g., electrically coupled to terminals of each battery cell), current shunts, ultrasound sensors, pressure sensors, magnetic sensors, piezo sensors, gas sensors, and others. In some examples, the output of the sensors may be used to trigger in-situ impedance testing (e.g., when a battery is at a particular SOC, voltage, and/or temperature). Furthermore, the output of the sensors (e.g., voltage probes) may be used to collect the impedance data (e.g., a voltage response profile) during the in-situ testing and/or supplement the impedance data. For example, the temperature data obtained by a thermocouple may be correlated with the impedance data (and, optionally, with other battery data), e.g., for the local analysis by battery pack controller 150 and/or for the global analysis by battery data system 102. In some examples, the process involves developing a weighted temperature cost function that when combined with time and impedance data, allows a more precise correlation of the impedance to temperature. In some examples, a test method involves measuring impedance at different temperatures, which is used, e.g., for cell modeling as the cell ages. Overall, correlating temperature and impedance data provides an additional level of granularity of the impedance data, which may be influenced by the temperature.

The architecture of battery pack 100 enables various features that are not available in conventional battery packs (with direct in series and/or parallel connections between the cells). As noted above, this architecture allows in-situ impedance spectroscopy analysis of each battery in battery pack 100, while battery pack 100 is operated and without any interference to the operation. Furthermore, this architecture allows interconnecting in series a large number of battery nodes, without compromising individual cell performance. Instead, the performance of each cell is maximized by testing each cell as well as operating each cell based on the test results. In-series strings are desirable for high-power applications, such as with automotive and grid-interactive solutions.

A brief description of node controllers, used in battery pack 100, is presented herein to provide additional detail of the cell operation control and testing capabilities. In some examples, a node controller comprises a power converter, such as a DC-DC converter or, more specifically, a bi-directional DC-DC converter. In some examples, a DC-DC converter is configured to step-up or step-down the voltage of first battery cell 114. The node controller determines the contribution of each cell in the node to the total power output of the node, e.g., through a duty cycle of the power converter. Due to the in-series connections of the nodes, the current flowing through each node is the same ($I_{BUS}=I_{NODE1}=I_{NODE2}=\ldots$). The bus voltage is the sum of voltages across all nodes ($V_{BUS}=V_{NODE1}+V_{NODE2}+\ldots$). However, the cells are functionally isolated from bus 140 by their respective node controllers. Even with a single cell per node, the cell voltage and the cell current can be different from the corresponding node voltage and the node current, determined by the duty cycle of the power converter. Referring to a node example with a single cell shown in FIG. 1A and ignoring power losses of the node controller, the power output of the cell ($P_{CELL}=V_{CELL} \times I_{CELL}$) is the same as the power output of the node ($P_{NODE}=V_{NODE} \times I_{NODE}$). In other words, the relationship between the cell voltage and the cell current as well the node voltage and the node current is as follows: $V_{CELL} \times I_{CELL}=V_{NODE} \times I_{NODE}$.

The node current is determined by the operation of battery pack 100, e.g., by load/supply 190 connected to battery pack 100. Assuming that the node current stays constant, when a power converter of the node controller reduces the cell current, the cell voltage goes up and/or the node voltage goes down. Often both occur at the same time. In some examples, no electrical current is flowing through the cell ($I_{CELL}=0$), which means that the voltage across the node is also zero ($V_{NODE}=0$). These examples may be used, e.g., to measure an open circuit voltage (OCV) of the cell. Furthermore, in these examples, no power is contributed by the node. In other examples, the entire node current is flowing through the cell ($I_{CELL}=I_{NODE}$), in which case the voltage across the node is the same as the voltage across the node ($V_{CELL}=V_{NODE}$) In other examples, the cell voltage is different from the node voltage (e.g., $V_{CELL}<V_{NODE}$).

FIG. 1B illustrates multiple cells per node example, which has additional capabilities comparing to the single-cell-per-node example of FIG. 1A. In the multiple cells per node example, the same node controller and, in more specific examples, the same power converter in this node controller is connected to two or more battery cells and independently controls each one of these two or more battery cells. The combined power output of multiple cells is the same as the power output of the node ($P_{NODE}=P_{CELL1}+P_{CELL2}+ \ldots$). The relationship between the cell voltages and the cell currents as well the node voltage and the node current is more complicated than, e.g., in the previous example with a single cell per node. With multiple cells, this relationship takes the following form: $V_{NODE} \times I_{NODE}=V_{CELL1} \times I_{CELL1}+V_{CELL2} \times I_{CELL2}+ \ldots$. While examples described below consider a node with two cells as, e.g., is shown in FIG. 1B. However, one having ordinary skill in the art would understand how to scale this example to a node with three or more cells.

Figure 1C:
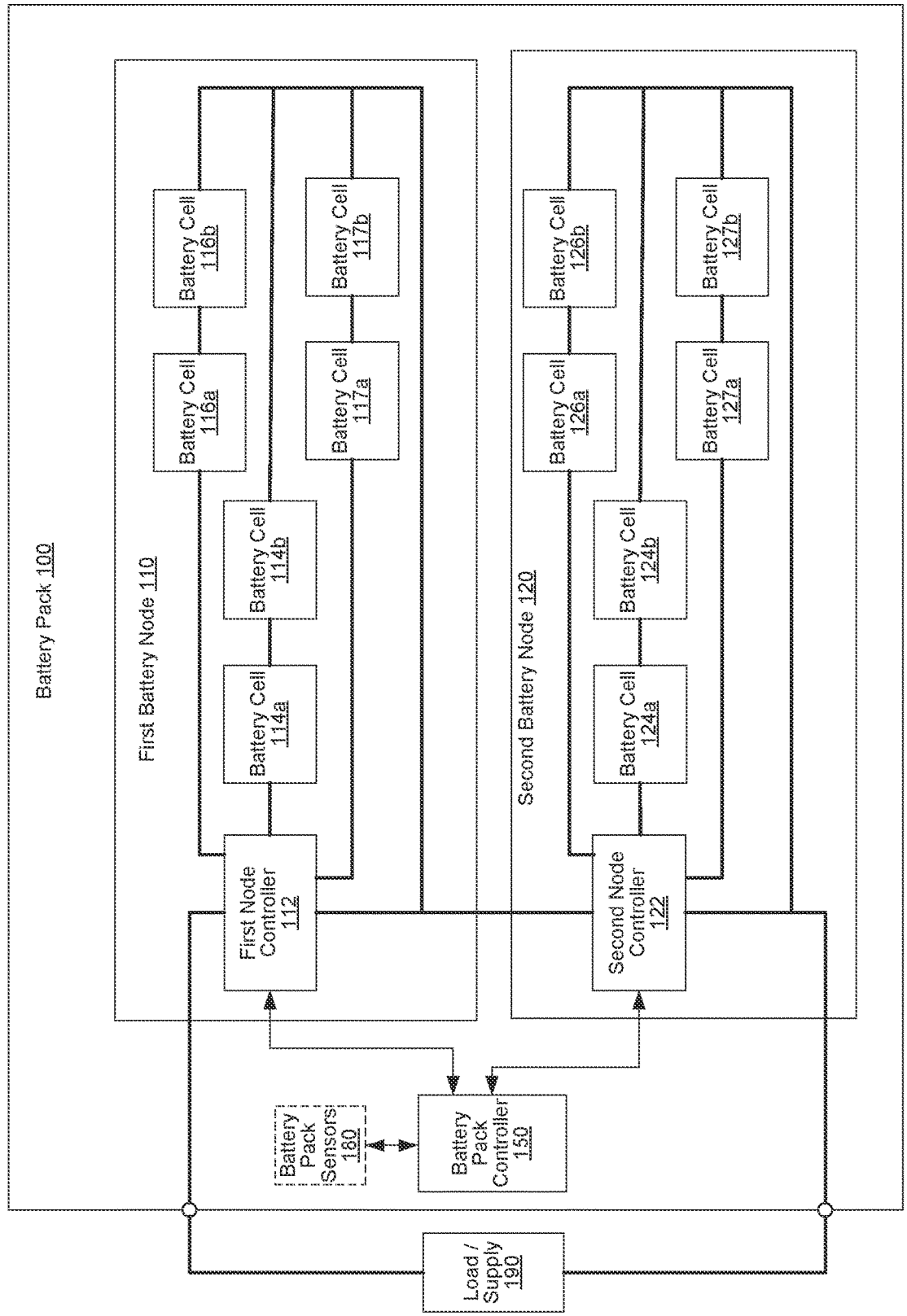
FIG. 1C is a schematic block diagram of another example of a battery pack, comprising multiple battery nodes, interconnected in series and controlled by a battery pack controller.

FIG. 1C illustrates another example of battery pack 100. In this example, each node comprises six cells, forming three sets connected in parallel to each other. Each set comprises two cells connected in series with each other within the set. Specifically, first battery node 110 comprises battery cells 114a and 114b (interconnected in series with each other, and forming a first set), battery cells 116a and 116b (interconnected in series with each other, and forming a second set), and battery cells 117a and 117b (interconnected in series with each other, and forming a third set). Each of these sets is connected in parallel to first node controller 112, which independently controls the operation of each set. Similarly, second battery node 120 comprises battery cells 124a and 124b (interconnected in series with each other, and forming a first set), battery cells 126a and 126b (interconnected in series with each other, and forming a second set), and battery cells 127a and 127b (interconnected in series with each other, and forming a third set). Each of these sets is connected in parallel to second node controller 122, which independently controls the operation of each set. This configuration may be referred to as a 3P/2S node. In this configuration, in-situ impedance testing may be performed on each set or individual cells (e.g., using separate voltage leads, which are not shown in FIG. 1C) or the entire group simultaneously. In general, any configuration of each battery node is within scope. A node with multiple cells (e.g., eight cells, twelve cells) may be also referred to as a battery pack module, a battery module, a cell module assembly, or a module. The cells of each module may have various types of connections with each other and a corresponding node controller. In some examples, the entire module is taken offline for testing one or more (e.g., all) cells of this offline module. Alternatively, only a subset of cells in a module is taken offline, while the remaining cells remain operational.

Figure 1D:
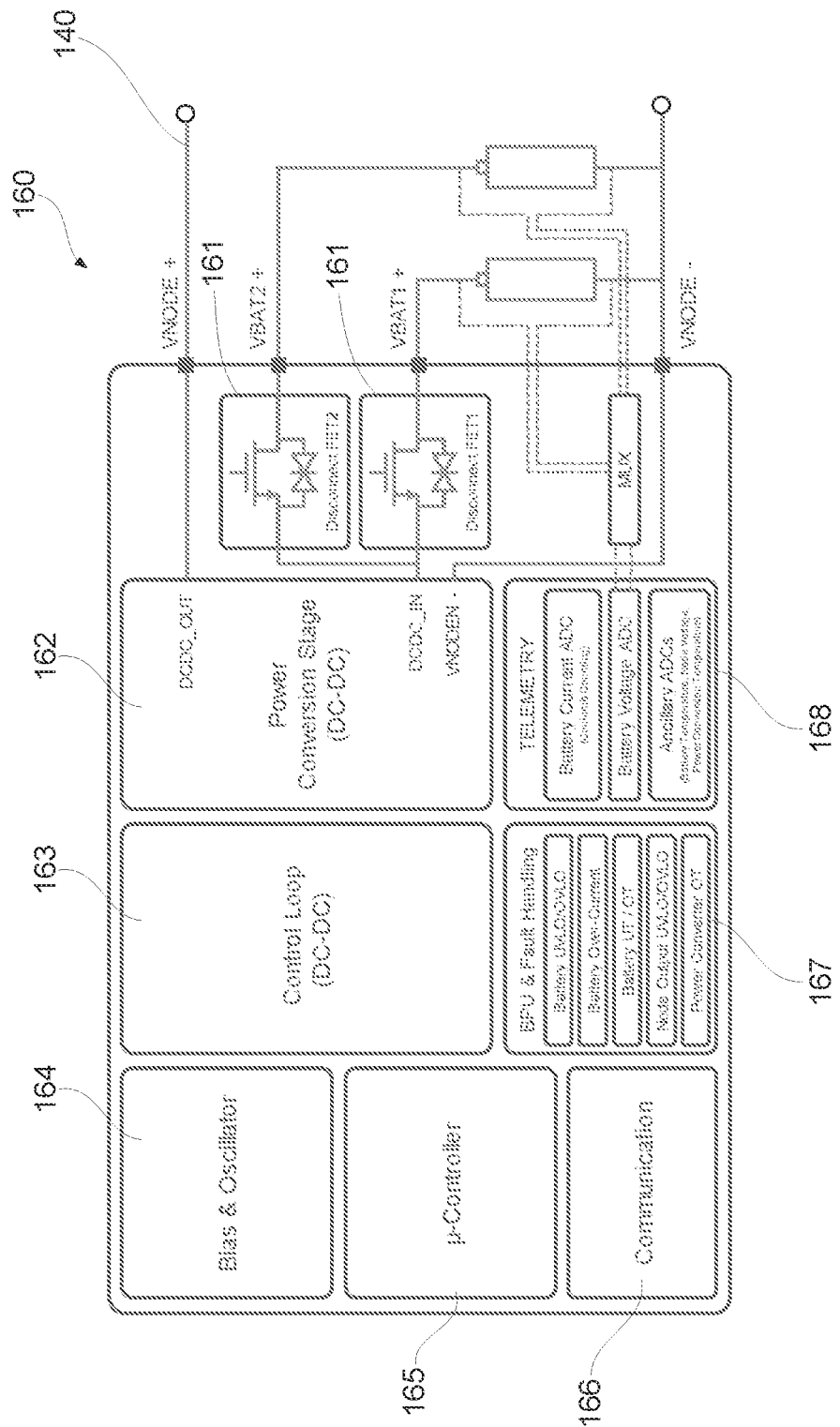
FIG. 1D is a schematic block diagram of a node controller, used in each node of a battery pack, in accordance with some examples.

FIG. 1D is a schematic illustration of node controller 160 used for controlling two battery cells, in accordance with some examples. One having ordinary skill in the art would recognize that node controller 160 may be configured to control any number of battery cells. These cells may be connected to node controller 160 in parallel (e.g., as shown in FIG. 1B), in series, or various combinations of in series and parallel connections (e.g., one example shown in FIG. 1C). Node controller 160 represents any one of the node controllers shown in FIGS. 1B and 1C. Node controller 160 comprises one or more switches 161, which may be a field-effect transistor (FET) switch as, for example, is shown in FIG. 1D. Other types of switches are also within the scope. Each switch is configured to connect and disconnect a corresponding battery cell (e.g., first battery cell 114 and additional first battery cell 116 in FIG. 1B) or a set of batteries (e.g., a first set comprising battery cell 114a and battery cell 114b, a second set comprising battery cell 116a and battery cell 116b, and a third set comprising battery cell 117a and battery cell 117b in FIG. 1C) from bus 140. It should be noted that the battery cells and bus are shown in FIG. 1D for context and these components are not parts of node controller 160.

In some examples, node controller 160 comprises bias and oscillator module 164. The bias part of this module sets the internal fixed voltage and current levels for other parts of node controller 160 (e.g., for controlling switches 161). The oscillator part provides a configurable clock signal for other parts of node controller 160, such as communication, FET switching, and analog-to-digital converters (ADCs). In some examples, node controller 160 comprises µ-Controller 165, which coordinates various node operations. Specifically, µ-Controller 165 is configured to execute the embedded control logic (e.g., software, firmware). In some examples, node controller 160 comprises communication module 166, which handles communication with other nodes and battery pack controller 150. In some examples, node controller 160 comprises control loop 163, which is configured to adjust switching characteristics of power conversion stage 162, e.g., to regulate the desired node output voltage and power. A combination of control loop 163 and power conversion stage 162 may be referred to as a power converter. The power converter is an optional component of node controller 160.

In some examples, node controller 160 comprises battery protection unit (BPU) and fault handling module 167. BPU and fault handling module 167 is configured to monitor the battery voltage and voltage conversion levels as well as corresponding currents. In some examples, BPU and fault handling module 167 is also configured to monitor temperatures of various components of node controller 160 and battery cells. Monitoring various other abnormal states of node controller 160 is also within the scope. In some examples, BPU and fault handling module 167 is configured to trigger various corrective actions (e.g., trigger a bypass). In some examples, node controller 160 comprises power conversion stage 162, which steps up or down the voltage level from the cell-side to the bus-side. In some examples, node controller 160 comprises telemetry module 168, which is configured to process various measurements (e.g., ADCs, voltage, current, temperature). Telemetry module 168 may also report the measurements to control loop 163, BPU and fault handling module 167, and external devices (e.g., battery pack controller 150) using communication module 166.

Figure 1E:
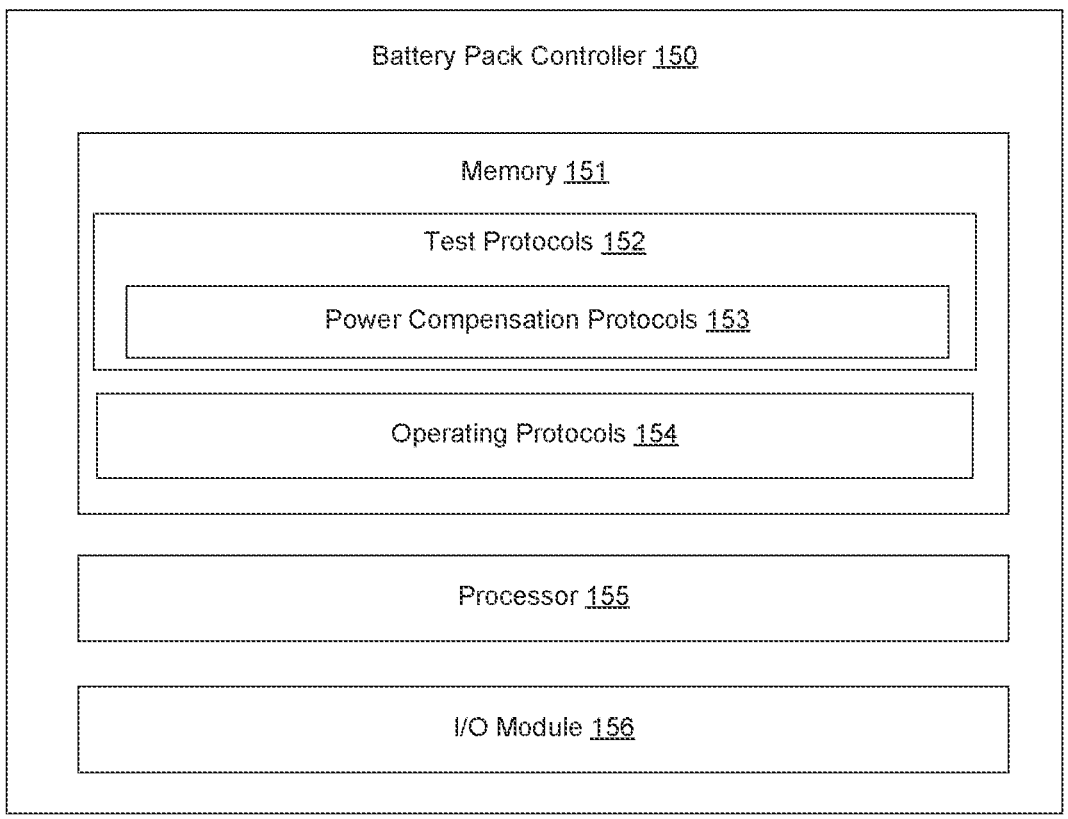
FIG. 1E is a schematic block diagram of a battery pack controller, showing various components and features, used by the battery pack controller to control operations of each node in a battery pack, in accordance with some examples.

FIG. 1E is a schematic illustration of battery pack controller 150, in accordance with some examples. Battery pack controller 150 comprises memory 151, configured to store various criteria for initiating in-situ impedance testing, test protocols 152 (e.g., starting SOC, duration, desired precision, power compensation protocols 153), operating protocols 154 (e.g., before and after testing) and test results. Some examples of these criteria include, but are not limited to, duration since the last test, exceeding certain thresholds (e.g., thresholds for charge/discharge currents, upper/lower temperatures) during cell operation, and others. Other examples are described below.

In some examples, battery pack controller 150 comprises input/output (I/O) module 156 to communicate with each node controller, battery pack sensors 180, and/or external systems (external to battery pack 100). For example, battery pack 100 may be a part of a larger system, such as an electric vehicle, grid-attached or off-grid energy storage system, and others as described above with reference to FIG. 1A. In the examples, I/O module 156 is configured to communicate with a battery data system, described above, to deliver test data, retrieve test protocols, and/or obtain new operating protocols.

In some examples, battery pack controller 150 is configured to proportionately or disproportionately distribute the pack power output among different nodes. This power distribution may be based on any operating parameters, SOH parameters, SOS parameters from this system, model parameters learned from other systems, and others. Furthermore, in some examples, battery pack controller 150 is configured to detect various degradation modes. For example, high cell impedance may be an indication of a high rate of cell degradation. On the other hand, low cell impedance may indicate internal shorts. Some causes of internal shorts include, but are not limited to, (a) unintended conductive particles that penetrate the separator and short the positive and negative electrodes and (b) growth of metallic dendrites (e.g. lithium, copper) from the negative electrode that pierces through the separator.

In some examples, battery pack controller 150 is configured to perform cell degradation analysis. This analysis may involve an estimate of the impedance by monitoring the evolution of the cell voltage while changing the current through the cell. Estimates of impedance exceeding a preset threshold or qualifying as an outlier (e.g., based on the histogram of comparable cells) provide various indications of cell degradation.

Battery pack controller 150 also comprises processor 155, which is configured to select test profiles and/or operating modes for controlling selected cells in battery pack 100. Processor 155 is also configured to determine the impedance of cells, e.g., based on voltage and current profiles for these cells, which are obtained from the corresponding node controller. In some examples, processor 155 is also configured to determine an operating mode for a battery cell, e.g., based on the impedance for this cell.

In some examples, processor 155 is also configured to determine a SOC of each battery cell. Processor 155 then selects test profiles and/or operating modes based, in part, on the SOC. For example, if a battery cell is close to being fully discharged, then this cell may not be available for impedance testing or power loss compensations during the impedance test of another cell.

Overall, battery pack controller 150 is configured to control each node controller to achieve one or more of the following: (1) vary cell loading to drive all cells to the same instantaneous voltage; (2) use an ESR estimate to drive all cell OCV voltages to the same instantaneous voltage; (3) incorporate an understanding of cell SOH to better reach 0%/100% SOC simultaneously; (4) predict/learn the (typical) loading parameters to better reach 0%/100% SOC simultaneously; (5) use SOH information of each cell to better reach 0%/100% SOC simultaneously; and (6) use SOH and an electrochemistry model to reach EOL simultaneously.

In some examples, battery pack controller 150 is configured to proportionately or disproportionately distribute the load based on any operating parameters, SOH parameters, SOS parameters, model parameters learned from other systems, etc.

In some examples, battery pack controller 150 is configured to detect various degradation modes, such as loose or corroded contacts that can create temperature hotspots under high loads and potentially trigger cell thermal runaways (e.g., by conducting heat through the wire/busbar) and/or fire hazard in the area surrounding the loose/corroded contacts.

In some examples, battery pack controller 150 is configured to perform cell degradation analysis. Specifically, cell degradation may correspond to capacity fade and power fade. Battery pack controller 150 is configured to quantify the power fade by measuring the cell impedance in-situ and comparing it to the reference data at the beginning of life. Additionally, the impedance data (e.g., at various frequencies) is used by battery pack controller 150 is to identify various degradation mechanisms of individual internal cell components (e.g., frequencies of greater than 10 Hz are attributed to conductors, contacts, and electrolyte, frequencies of 1-to-10 Hz correspond to charge transfer mechanics (e.g., SEI growth), and frequencies below 1 Hz corresponding to the diffusion of lithium-ions into the electrodes active materials). In some examples, impedance testing is performed at frequencies of between about 1 Hz and 1 MHz, such as between 100 Hz and 10 kHz. Once identified, these degradation mechanisms are used to change the operating parameters (e.g., charge/discharge rates, cutoff voltages) of the cell or completely bypass the cell (e.g., after slowly discharging the cell to a SOC of less than 20% or even less than 10%). Furthermore, these degradation mechanisms may be analyzed collectively over a large number of cells (e.g., in the same battery pack, different battery packs, different power systems such as across fleets of power systems).

Examples of Global Data Analysis

Figure 2A:
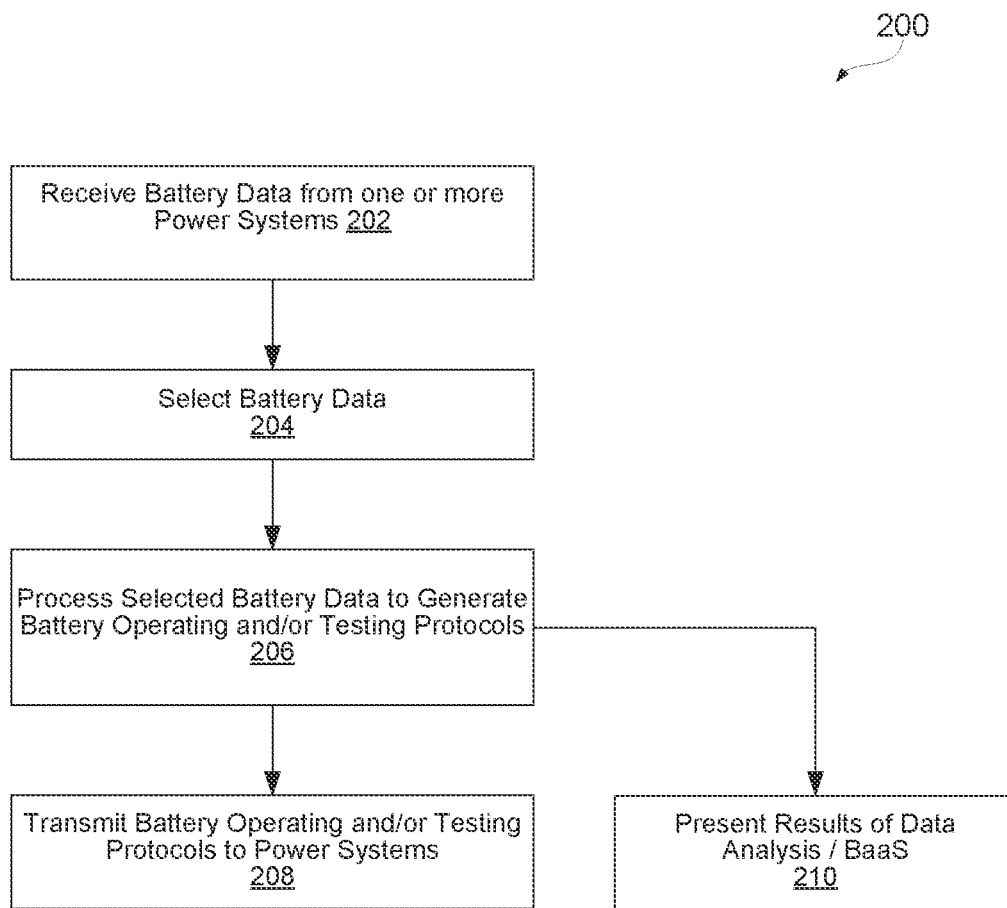
FIG. 2A is a process flowchart corresponding to a method for collecting and analyzing battery data from multiple power systems and developing new battery operating procedures and/or new battery testing protocols for these power systems, in accordance with some examples.

FIG. 2A is a process flowchart corresponding to method 200, representing various examples of global battery data analysis. This global battery data analysis may be performed by battery data system 102 or, more specifically, by battery data processing engine 105, various examples of which are described above with reference to FIG. 1A. The global battery data analysis is performed, for example, in addition to or instead of a local battery data analysis at a battery pack level (e.g., performed by a battery pack controller). In some examples, the results of battery pack controller analysis (e.g., the impedance is determined using a battery pack controller based on OCV changes over time) are supplied to battery data system 102 as battery data for further processing.

In some examples, method 200 comprises receiving (block 202) battery data from one or more power systems. Some examples of the battery data include, but are not limited to, impedance, temperature, previous operating parameters (e.g., several charge-discharge cycles, cut-off voltages, SOCs, and charge/discharge rates), and others. The battery data corresponds to specific battery nodes (e.g., based on the identification of each node) and, in some examples, is separated into sets (e.g., each set corresponding to one node). For example, each node may have unique identification in battery ecosystem 103. The battery data may be encrypted, compressed, and/or other preprocessed (e.g., identify degradation modes) before transmitting from the power systems to battery data system 102. For example, the received battery data comprises various determinations made at the battery pack level, such as state-of-health, state-of-power, and/or state-of-safety. This battery data may represent different power systems, different battery packs, and different battery cells. In some examples, the battery data may represent the same type of cells (e.g., cells having the same design) or different types of cells. The selection of different data sets, representing different battery nodes, (e.g., for aggregate analysis, benchmarking, and/or comparison) and/or data sets, representing the same battery node but at different test times, is performed at battery data system 102. In some examples, battery manufacturers produce multiple cell designs (e.g., an 11-Ah cell and a 55-Ah cell) using the same type of cell components (e.g., electrodes, electrolytes). The knowledge derived from one cell type may be relevant to another cell type. In some examples, battery data is received as a continuous stream of semi-structured data.

In some examples, power system 101 is configured for wired/wireless transfer (e.g., secure communication channels) of battery data to a battery data system. Power system 101 or, more specifically, each battery node may have a unique identifier (UID), which may be a vehicle identification number for electrical vehicles (EVs). Furthermore, power system 101 may include an application programming interface (API) key for identity authentication. When power system 101 is connected to battery data system 102, power system 101 uploads structured data (e.g., adhering to a schema, such as tabulated or SQL database) or unstructured data (e.g., records pairs). In some examples, battery data is aggregated into an array form. More specifically, the data may be aggregated based on a node id and/or sorted by chronological order. In some examples, a subset of the most recent data (e.g., last week, last month) is selected for trend analysis. The battery data is stored in battery data store 104, which may be a database, specifically configured for the battery data.

In some examples, method 200 comprises selecting (block 204) the battery data received from different power systems, e.g., based on the cell type, temperature, age, SOC, battery application (e.g., grid, residential, EV), and other like parameters. For example, battery data from different nodes or even different power systems may be used to compensate for differences among cells and provide for meaningful comparison. This operation may involve various data sorting algorithms.

In some examples, method 200 comprises processing (block 206) the selected battery data to determine degradation modes and/or generate battery operating protocols (e.g., determine new operating parameters), future battery testing protocols, and other like protocols. Global battery data helps with finding data trends and/or applying various predictive models to anticipate failures (e.g., based on one or more degradation modes) before these failures occur and to utilize various preemptive measures to avoid these failures. For example, a cell with increased impedance may be switched to an operating protocol with cell-preserving parameters (e.g., smaller charge/discharge currents, different cut-off voltages, and others).

In some examples, self-learning methodologies (e.g., machine-learning, deep-learning, or even multi-modal machine-learning) are applied to process the data and, more specifically, to develop new battery testing protocols and/or to revise previous test protocols. For example, initial impedance data may be used to identify an initial degradation mode, which is verified using a revised test. One example of this feedback-loop testing is adaptive charging, where impedance data is collected at different charging schema (e.g., fast charging of 10C vs. normal charging of 1C).

In some examples, processing the selected battery data involves an outlier detection scheme. One specific example involves a numeric outlier technique, e.g., a numeric value beyond $0.3+k*IQR$, where "IQR" represents the interquartile range, "Q3" represents the third quartile, and "k" represents interquartile multiplier value. Another example of outlier detection is a Z-score technique, which assumes a Gaussian distribution of the battery data with the outliers positioned in the tails of the distribution. For example, the distribution of impedance values may be used, as measured within a battery pack, a subset of a battery pack, a power system, or multiple power systems.

In some examples, data processing involves one or more business intelligence dashboards (e.g., corresponding to product usage trends and patterns), operational monitoring (e.g., identifying degradation modes), anomaly detection (e.g., variations in battery data), embedded analytics (e.g., providing operators of power systems various access to data and reports), and data science (e.g., advanced analytics and machine learning for predictive testing and maintenance of battery packs, development of new test and operating protocols, artificial intelligence (AI) development).

In some examples, method 200 comprises transmitting (block 208) the battery operating protocols and/or battery testing protocols to different power systems. The selection of power systems (for new protocol) may be based on information available to battery data system 102 about these power systems. Some examples of this information include, but are not limited to, impedance testing results, impedance testing protocols, power compensation profiles, cell operating profiles, outlier (or unsafe) cell identification, fault reaction, and others. This information may be collectively referred to as battery data.

For example, the operation of multiple EVs generates data for each cell in these EVs. For context, a typical 10-100 kWh battery pack used for EVs may include hundreds or even thousands of cells. Many EVs are operated using different operating parameters (e.g., charge/discharge rates, SOCs, pack temperatures). As such, individual cell data from multiple EVs frequently collected over long periods (e.g., EV operating lifetime) can be easily characterized as "big data" or, more specifically, "big battery cell data." Raw data corresponding to cells for multiple EVs is aggregated and processed by battery data system 102, which may be referred to as a cloud. This data is processed to evaluate degradation modes or, more specifically, failure modes. Furthermore, in some examples, this data is combined with user profiles (e.g., vehicle identification numbers, owners of EVs). Based on these determined degradation modes and degradation modes, battery management settings are determined for each user profile/battery pack 100. Some examples of the raw data include, but are not limited to, impedance, exposed temperatures, temperature responses to power take in or take out, SOCs, charge/discharge rates, impedance, resistances, capacitances, magnetic fields distribution, and time. In some examples, impedance values are presented as a function of temperature, SOC, and time as well as degradation modes when preprocessed in the system level. For example, during this data analysis, lithium plating is detected for a certain user profile associated with a high performance (e.g., high charge/discharge currents) but a smaller used range defined by the SOC. Based on this degradation mode, battery pack 100 is instructed to use lower cut off voltages for the suspect batteries, to operate in low impedance regimes, and/or to manage the cutoff voltages based on the cell temperature (e.g., reduce an upper cut off voltages at low temperatures to mitigate further lithium plating).

Furthermore, individual cell data (from multiple EVs) provides higher statistical accuracy than, for example, data available at the EV level or just a few test cells. In some examples, this big battery cell data is used to generate more precise maintenance requirements or lifetime predictions of the EVs, battery packs, and even specific cells. Self-learning cloud-based processing is used, for example, to improve the management of individual battery packs and even individual cells within these packs. In some examples, this battery pack is customized for each user and may involve independent management of each cell in a battery pack. Furthermore, this big battery cell data may be used to improve the manufacturing of battery cells and/or battery packs. For example, a first cell generation is used in an EV fleet, for which the big battery cell data is collected. Based on the global analysis of this data, a second cell generation is developed. Additional development of battery cycles with these feedback loops is within the scope.

In some examples, cell data collected from a fleet of EVs (e.g., corresponding to a specific make-model) allows for faster data processing and real-time battery management of these EVs. For example, cell data may be used for a prediction of range, charge requirement for the next trip (e.g., full charging, partial charging, charging in a certain cut-off voltage range), and power requirements, all of which may be more precise than currently available. For example, an upcoming trip is short but requires lots of power (e.g., driving up a steep hill or at highway speeds). In this example, the battery pack of this particular EV is charged to a certain SOC while the power and efficiency are optimized during the utilization of this power. In another example, a degradation mode identified in one EV is used to update the operating modes of battery packs of the entire EV fleet.

In some examples, cell data is collected from multiple stationary storage systems. This cell data is processed in the cloud to determine various degradation modes or, more specifically, failure modes. Based on these degradation modes and degradation modes, battery management is updated. For example, a specific system is used to achieve high power peaks without requiring a large storage capacity. Furthermore, the system may be operated in low impedance regimes. In some examples, the cut-off voltage used for the operation of this system may be temperature-dependent (e.g., reducing upper cut-off voltages at lower temperatures to mitigate further lithium plating).

In some examples, a stationary battery system is used for power storage from a solar array or a wind farm. In these examples, the analysis of cell data is combined with the weather forecast (e.g., sunlight intensity and duration, wind speed), charge requirement to satisfy energy profile for an upcoming next period (e.g., full charging, partial charging, charging in a certain cut off voltage range), and/or power requirement.

In some examples, method 200 involves presenting results of the data analysis (block 210) to one or more users in battery ecosystem 103. These users may be power system manufacturers, power system owners, and/or third parties (e.g., researchers). For example, battery data system 102 may provide a user interface for controllably accessing, retrieving, managing, and/or analyzing the battery data. In some examples, battery data system 102 is configured to manage the battery data ownership and/or data accessibility.

Examples of In-Situ Impedance Spectroscopy Analysis

Figure 2B:
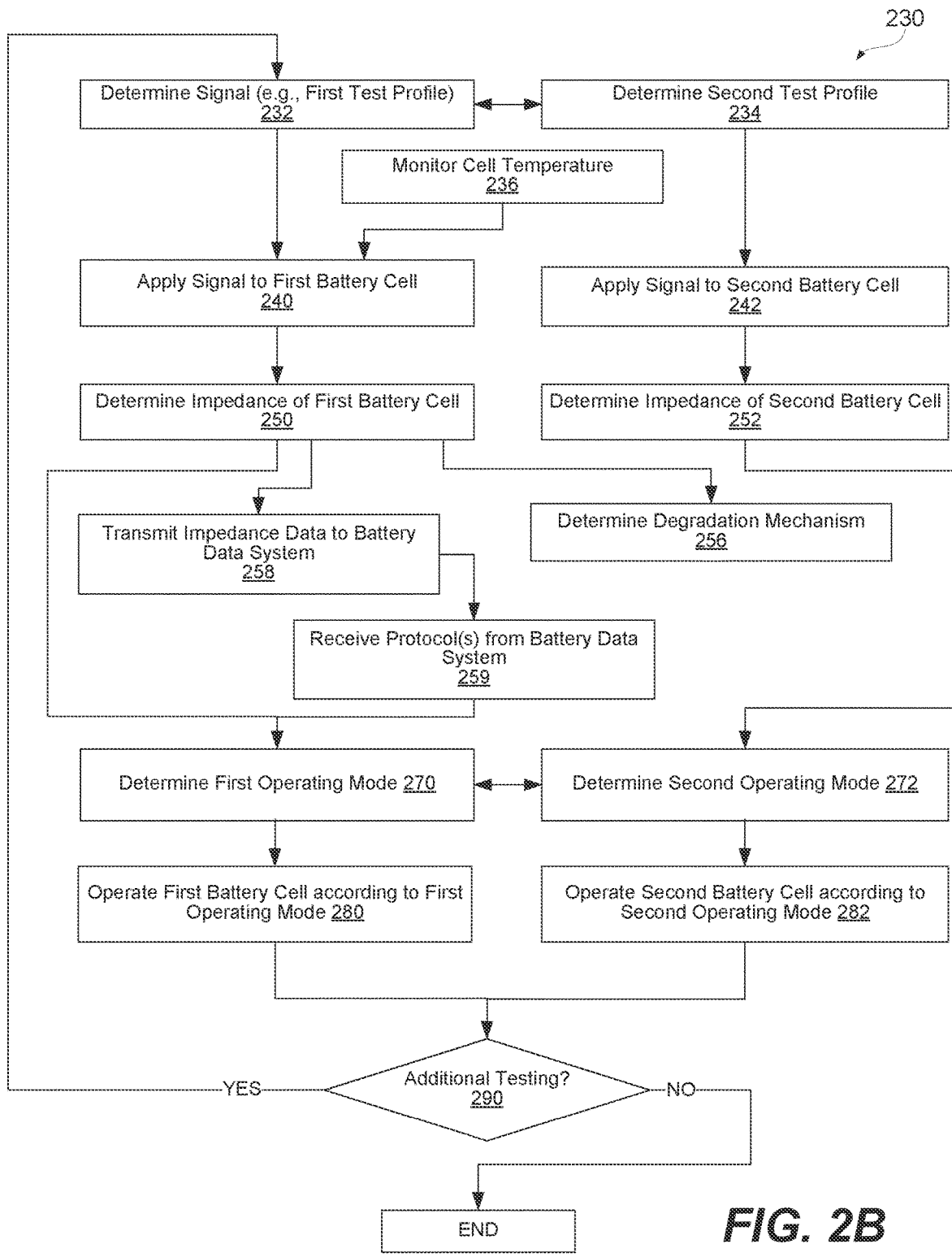
FIG. 2B is a process flowchart corresponding to a method for an in-situ impedance spectroscopy analysis of each battery cell in a battery pack, in accordance with some examples.

FIG. 2B is a process flowchart corresponding to method 230 for an in-situ impedance spectroscopy analysis of battery cells in battery pack 100, in accordance with some examples. Various details and examples of battery pack 100 are described above with reference to FIGS. 1A-1E.

In some examples, method 230 comprises determining (block 232) a signal to be applied to first battery cell 114 for an in-situ impedance spectroscopy analysis. In some examples, the signal comprises a test profile. The test profile is later used to operate first battery cell 114 (e.g. by first node controller 112) to determine the impedance of first battery cell 114 (e.g., as further described below with reference to FIG. 4). Also, various examples of test profiles are described below. In some examples, a signal/test profile involves changes of the electrical current through first battery cell 114, which causes a response of first battery cell 114 (e.g., changes in voltage across first battery cell 114). The test profile is determined, for example, using battery pack controller 150. For example, battery pack controller 150 selects the first test profile from different profile options available in memory 151 (e.g., in a test profile database). In some examples, the test profile is transmitted to battery pack 100 from battery data system 102. For example, method 230 comprises receiving instructions (e.g., comprising testing profiles) at battery pack 100 and from battery data system 102 for an in-situ impedance spectroscopy analysis of battery cells in battery pack 100.

In some examples, the signal/test profile is determined based on the current operating state of first battery cell 114, such as the SOC of first battery cell 114, the temperature of first battery cell 114, previous operating history of first battery cell 114. For example, if first battery cell 114 is close to its fully discharged state, the first test profile may not include significant increases in the electrical current while the power is drawn from first battery cell 114 during the impedance testing. Similarly, if first battery cell 114 is close to its fully charged state, the first test profile may not include significant decreases in the electrical current while the power is supplied to first battery cell 114 during the impedance testing.

In some examples, the test profile is further determined based on the bus voltage and/or the bus current of battery pack 100. This voltage and current may be also referred to as a pack voltage and a pack current. A combination of the bus voltage and the bus current determines the pack power output, which may be either positive (e.g., battery pack 100 is being discharged) or negative (e.g., battery pack 100 is being charged). Depending on the level of this power output, different test profiles may be selected. For example, a large bus current may limit possible current variations at the cell level, available for impedance testing.

In some examples, method 230 comprises determining (block 234) a second test profile. The second test profile is used, for example, to control one or more other battery cells in battery pack 100 to compensate for some or all power variations associated with the testing of first battery cell 114. Furthermore, in some examples, the impedance of these other battery cells is determined, while these cells are operated per the second test profile. Similarly, method 230 may involve determining additional test profiles, e.g., when multiple cells are used for power compensation and/or impedance testing.

In some examples, method 230 further comprises monitoring (block 236) the temperature of one or more tested cells, such as first battery cell 114. More specifically, this monitoring operation comprises obtaining one or more temperature readings of first battery cell 114 prior to applying the signal to first battery cell 114 and/or obtaining one or more temperature readings of first battery cell 114 while applying the signal to first battery cell 114. The signal applying operation is represented by block 240 and is described below.

These temperature readings may be used, e.g., to trigger the in-situ impedance spectroscopy analysis. For example, applying the signal to first battery cell 114 may be performed when the temperature of first battery cell 114 is within a predetermined range. In some examples, the in-situ impedance spectroscopy analysis of first battery cell 114 may be repeated for different temperatures of first battery cell 114, e.g., to determine various possible degradation modes of first battery cell 114. Furthermore, in some examples, method 230 involves correlating the one or more temperature readings (obtained while applying the signal to first battery cell 114) to the impedance of first battery cell 114. Overall, the effect of the temperature on the cell impedance will be understood by one having ordinary skill in the art. Therefore, in these examples, the impedance analysis is performed in the context of the cell temperature.

In some examples, method 230 comprises applying (block 240) a signal to first battery cell 114 while battery pack 100 remains operational and provides the power output (e.g., to load 190). For example, at least one other battery cell of battery pack 100 continues to charge or discharge, contributing to the power output of battery pack 100, during this operation. In some examples, applying the signal comprises operating first battery cell 114 according to a first test profile such as changing the electrical current through first battery cell 114. This operation (block 240) is performed using first node controller 112. First node controller 112 is connected (e.g., in series) with second node controller 122 and/or other node controllers of battery pack 100. In some examples, first node controller 112 comprises a power converter, which is used to change the electrical current passing through first battery cell 114.

In some examples, the pack voltage or, more specifically, the bus voltage across first node controller 112 and second node controller 122 remains unchanged (e.g., substantially unchanged) while switching the operation of first battery cell 114 to the first test profile. For purposes of this disclosure, the term "substantially unchanged" means that any change is less than 5%, less than 2%, or even less than 1%, in some examples. More generally, the bus voltage between first battery pack terminal 141 and second battery pack terminal 142 remains substantially unchanged. As such, the power output of battery pack 100 remains substantially unchanged during this switch. In other words, switching first battery cell 114 to the first test profile does not impact the operation of battery pack 100.

It should be noted that the power output of first battery cell 114 changes while first battery cell 114 is switched to the first test profile. However, any changes to this power output of first battery cell 114 are compensated by one or more other battery cells in battery pack 100. Various examples of this power compensation by other cells will now be described in more detail.

In some examples, applying the signal to first battery cell 114 is performed when the SOC of first battery cell 114 is within a predetermined range, such as at least 10%, at least 20%, at least 50%, at least 80%, or at least 90%.

In some examples, applying the signal to first battery cell 114 is triggered by battery pack controller 150. As described above with reference to FIGS. 1B and 1C, battery pack controller 150 is communicatively coupled to first node controller 112, which in turn controls electrical connections to first battery cell 114. For example, applying the signal to first battery cell 114 is triggered based on at least one of the operating history of first battery cell 114, the operating history of battery pack 100, the testing history of first battery cell 114, the testing history of battery pack 100, the SOC of first battery cell 114, the SOC of battery pack 100, the temperature of first battery cell 114, the OCV of first battery cell 114, the voltage of first battery cell 114 under a set load, or the test data analysis of battery cells equivalent to first battery cell 114. For purposes of this disclosure, equivalent battery cells are defined as cells with the same design (e.g., materials, form-factor) or at least the cells sharing one or more common characteristics (e.g., materials). In some examples, applying the signal to first battery cell 114 is triggered based on the input received by battery pack 100 from battery data system 102, communicatively coupled to battery pack 100. Various examples of such input are described above with reference to FIG. 1A and FIG. 2A.

In some examples, at least some of this power compensation is provided by second battery cell 124, which is a part of second battery node 120. In these examples, method 230 comprises applying (block 242) a second signal to second battery cell 124, such as operating second battery cell 124 according to a second test profile. This operation may be performed using second node controller 122. In some examples, this operation involves changing the current through second battery cell 124. Second battery cell 124 may be a part of a different node or the same node as first battery cell 114. Different cell arrangements within each node are described above with reference to FIGS. 1B and 1C.

This second signal/second test profile is designed to compensate for some or all of the power changes due to switching to and operating first battery cell 114 according to the first test profile. In other words, the bus voltage across first node controller 112 and second node controller 122 remains unchanged by operating second battery cell 124 according to the second test profile using the second node controller 122. For example, this second signal is complementary to the signal applied to first battery cell 114, which is described above with reference to block 240. To ensure that the bus voltage remains unchanged, switching the operation of first battery cell 114 to the first test profile and switching the operation of second battery cell 124 to the second test profile is performed simultaneously.

In a more specific example, the entire power compensation is provided by second battery cell 124, which will now be described with reference to FIG. 1A as well as FIGS. 3A and 3B. Specifically, FIG. 1A illustrates an example of battery pack 100 in which only battery cell is connected to each node controller. When first battery cell 114 is switched to the first test profile, the power output of first battery node 110 changes. In this example, this change is compensated by second battery node 120 or, more specifically, by second battery cell 124. It should be noted that in this example, third battery node 130 is either not present in battery pack 100 or third battery node 130 is not used (e.g., by battery pack controller 150) for this power compensation. However, one having ordinary skill in the art would understand how to extend this example to situations where third battery node 130 is also used for power compensation. Furthermore, in some examples, the power compensation, provided by one or more other battery cells in battery pack 100, dynamically changes while applying the signal to first battery cell 114. These dynamic changes ensure that battery pack 100 can support different power output demands during the in-situ impedance spectroscopy analysis.

Figure 3A:
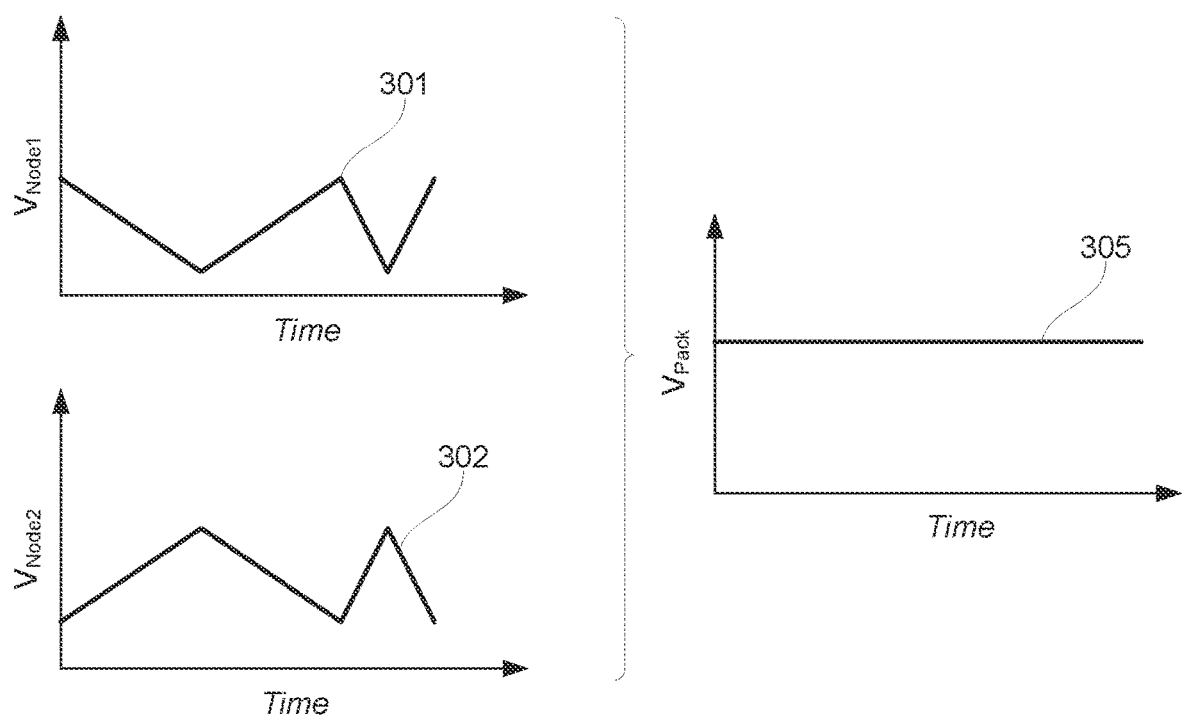
FIGS. 3A and 3B are different examples of node voltage profiles and corresponding pack voltage profiles.
Figure 3B:
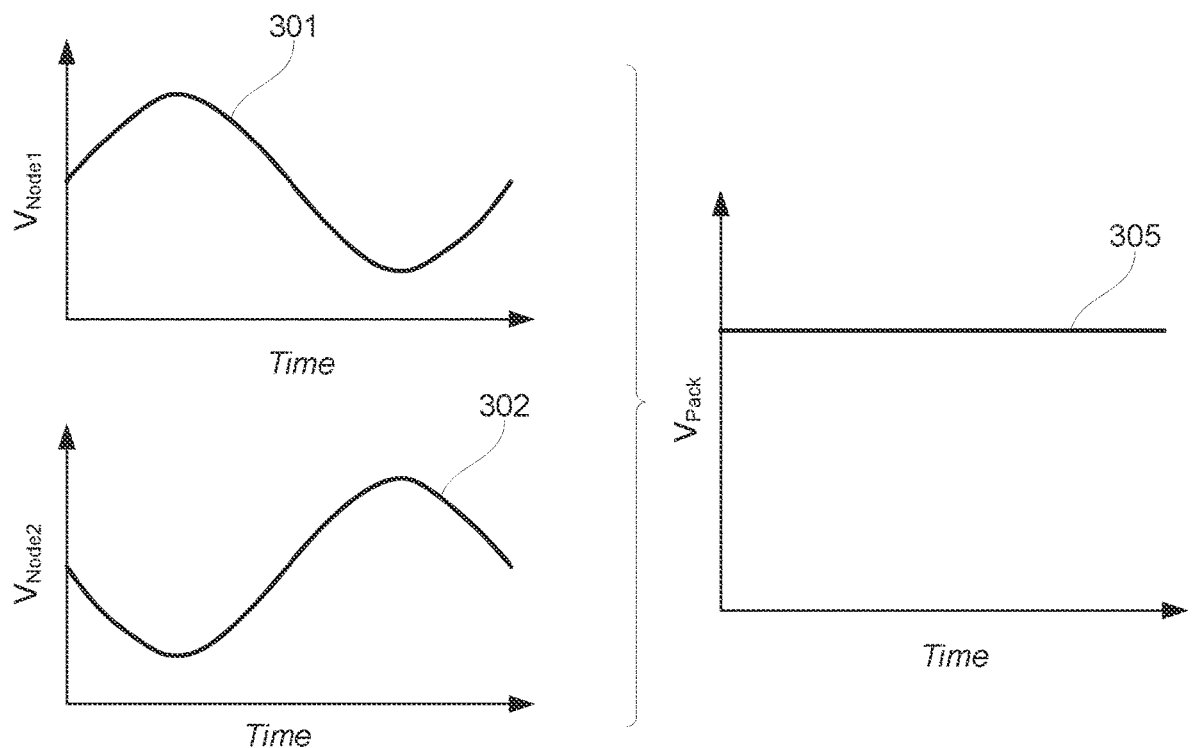

Each of FIGS. 3A and 3B illustrates an example of two-node voltage profiles (line 301 corresponding to the first node voltage profile and line 302 corresponding to the second node voltage profile) and a resulting pack voltage profile (line 305). Because of the in-series connection of first battery node 110 and second battery node 120 and assuming that first battery node 110 and second battery node 120 are the only battery nodes in battery pack 100, the pack voltage profile ($V_{Pack}$) is a sum of the first node voltage ($V_{Node1}$) and the second node voltage ($V_{Node2}$), i.e., $V_{Pack}=V_{Node1}+V_{Node2}$.

The first node voltage profile (line 301 in FIGS. 3A and 3B) changes over time due to switching of first battery cell 114 to the first test profile. FIGS. 3A and 3B illustrate different examples of the first node voltage profile, while corresponding to different examples of the first test profile, further described below. However, the second node voltage profile (line 302 in FIGS. 3A and 3B) is selected and applied such that the pack voltage profile (line 305) remains constant. More specifically, in this two-node example, the first node voltage profile and the second node voltage profile are complementary to each other such that any increase in the first node voltage ($V_{Node1}$) has a corresponding decrease in the second node voltage ($V_{Node2}$) and vice versa.

Returning to FIG. 2B, method 230 comprises determining (block 250) an impedance of first battery cell 114 based on a voltage profile and a current profile of first battery cell 114. This voltage profile and the current profiles are obtained while operating first battery cell 114 per the first test profile. This operation may be performed by first node controller 112 (e.g., for tests performed at frequencies of 1 kHz and above) and/or by battery pack controller 150 (e.g., for test performed at frequencies below 1 kHz). Furthermore, in some examples, the impedance of first battery cell 114 is determined externally (e.g., battery data system 102), in which case the voltage profile and the current profile of first battery cell 114 are also transmitted externally.

Figure 4:
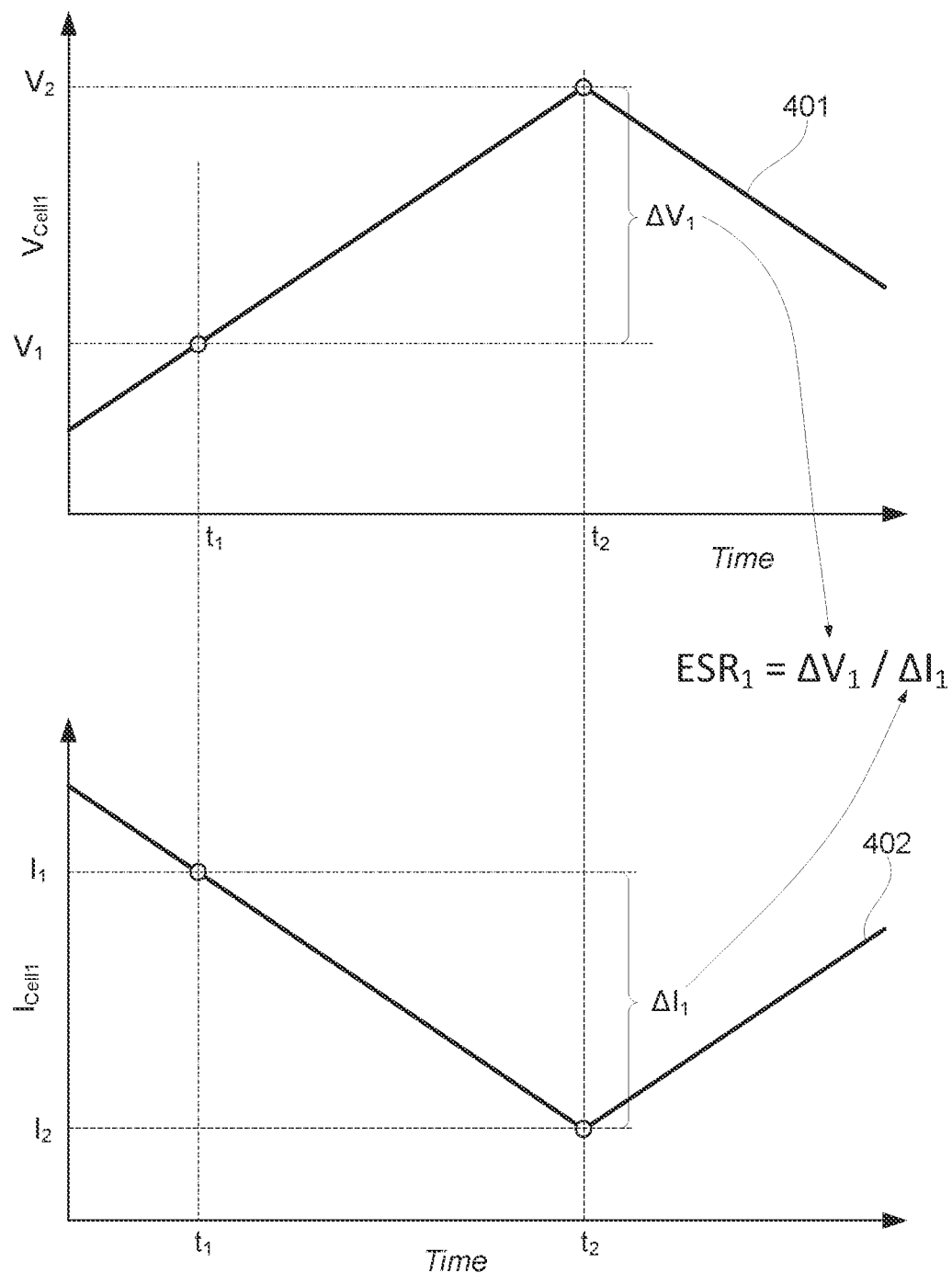
FIG. 4 is an example of a signal used for determining the impedance of a battery cell.

FIG. 4 illustrates one example of the first test profile, which is represented by a combination of first cell voltage profile 401 and corresponding first cell current profile 402. It should be noted that this test profile is set and controlled by first node controller 112 and is different from node profiles. In some examples, the first cell voltage ($V_{Cell1}$) is different from first node voltage ($V_{Node1}$). Similarly, the first cell current ($I_{Cell1}$) is different from the first node current ($I_{Node1}$). As noted above, because of the in-series connections of the battery nodes, the first node current ($I_{Node1}$) is the same as the second node current ($I_{Node2}$) and the same as the battery pack current, i.e., $I_{Node1}=I_{Node2}=\ldots=I_{Pack}$.

When less current ($I_{Cell1}$) is being drawn from first battery cell 114, the cell voltage ($V_{Cell1}$) tends to increase. Specifically, the first cell voltage ($V_{Cell1}$) increases from $V_1$ at a first time reference ($t_1$) to $V_2$ at a second time reference ($t_2$). During the same time frame, the first cell current ($I_{Cell1}$) decreases from $I_1$ to $I_2$. This combination of the voltage increase and the current decrease is reflective of the impedance of first battery cell 114 or, more specifically, of equivalent series resistance (ESR) of first battery cell 114, in accordance with the following relationship: $ESR_1 = \Delta V_1 / \Delta I_1$. It should be noted that the ESR of first battery cell 114 may be estimated for any kind of test profiles, including nonlinear profiles.

Furthermore, ESR may be used to estimate the OCV of first battery cell 114 based on the following relationship: $V_1 \approx I_1 \times ESR_1 + OCV_1 \rightarrow OCV_1 \approx V_1 - I_1 \times ESR_1$. In other words, the OCV of first battery cell 114 is determined while the current continues to flow through first battery cell 114.

Overall, this method allows isolating the impedance contribution to the external/measurable cell voltage, which in turn allows back-calculating the OCV. The OCV is an excellent indicator for a state-of-charge (SOC), which can be determined by taking the cell offline. This is a unique feature provided by the battery pack architecture described above and is not available with conventional BMS.

Figure 8:
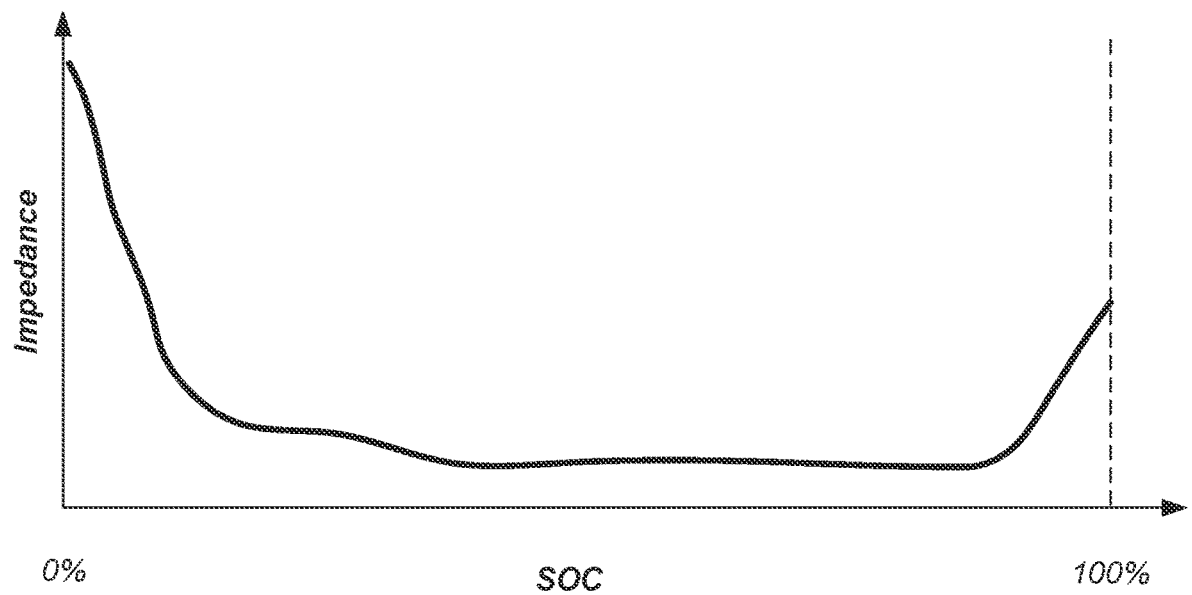
FIG. 8 is a schematic plot of impedance as a function of the state of charge (SOC).

The impedance of some battery cells (e.g., intercalation cells such as lithium-ion) varies with the SOC. Without being restricted to any particular theory, it is believed that electrodes' stoichiometry changes with the SOC resulting in the impedance change. A sharp increase in impedance is typically observed towards the end of the discharge (i.e., as the SOC approaches 0%) as, e.g., is schematically shown in FIG. 8. This relationship is used for the detection of high and low SOC limits, based on the determined impedance.

The first test profile shown in FIG. 4 may be referred to as a linear profile. Other examples of the first test profile include a step profile (described below with reference to FIGS. 5A and 5B), a sinusoidal profile (described below with reference to FIGS. 6A and 6B), and other types of profiles (one example of which is described below with reference to FIGS. 7A and 7B).

In some examples, method 230 further comprises determining (block 252 in FIG. 2B) an impedance of second battery cell 124. This impedance is determined based on a voltage profile and a current profile obtained from second battery cell 124, while second battery cell 124 is operated according to the second test profile. The second test profile is used to fully or partially compensate for power output changes associated with switching to and operating first battery cell 114 according to the first test profile. Therefore, the first and second test profiles tend to be inverse of each other. In some examples, e.g., when the power output changes are entirely offset by second battery cell 124, the second test profile is complementary to the first test profile. This feature ensures that the bus voltage across first node controller 112 and second node controller 122 remains unchanged.

As noted above, when less current is being drawn from a battery cell, the cell voltage tends to increase. On the flip side, when more current is being drawn from a battery cell, the cell voltage tends to decrease. In either case, a combination of the voltage increase and the current decrease may be used to determine the impedance of a battery cell. As such, the impedance of second battery cell 124 may be determined from the second test profile, like determining the impedance of first battery cell 114, described above.

In some examples, method 230 further comprises determining at least one of a cell open-circuit voltage (OCV) of the first battery cell 114 and a cell state of charge (SOC) of the first battery cell 114 based on the voltage profile and the current profile of the first battery cell 114.

In some examples, method 230 further comprises determining (block 256) one or more degradation modes of first battery cell 114 based on at least the impedance of first battery cell 114. For example, high impedance may be an indication of an interfacial resistance at the positive electrode and other like degradation modes.

In some examples, method 230 further comprises transmitting (block 258) data representing the impedance of first battery cell 114 (the impedance data) from battery pack 100 to battery data system 102. As described above with reference to FIG. 1A, battery data system 102 is communicatively coupled to battery pack 100. In some examples, method 230 also comprises aggregating the impedance data with additional impedance data, forming at least a portion of the aggregate battery data. The aggregate battery data may include impedance from multiple different battery cells, nodes, battery packs, and power systems. For example, the aggregate battery data may be fleet-wide battery data. In some examples, the additional impedance data is received by battery data system 102 from a fleet of power systems comprising additional battery packs, equivalent to battery pack 100. Battery data system 102 then analyzes this aggregate battery data as described above with reference to FIG. 2A. In some examples, method 230 further comprises receiving (block 259), at battery pack 100 and from battery data system 102, one or more of an in-situ impedance spectroscopy analysis protocol, a power compensation protocol, or a cell operating protocol. These protocols may be developed, at least in part, based on the impedance data received from battery pack 100 (e.g., the impedance of first battery cell 114).

In some examples, method 230 further comprises determining (block 270) a first operating mode for first battery cell 114 to use, after completing the first test profile. For example, the first operating mode may be determined based on the impedance of the first battery cell 114. In some examples, the first operating mode is different from the operating mode of first battery cell 114, before operating first battery cell 114 according to the first test profile. For example, if the impedance of first battery cell 114 exceeds a certain threshold value then various operating limitations may be applied to first battery cell 114, such as a maximum operating current as well as minimum and maximum cut-off voltages.

In some examples, method 230 further comprises comparing the impedance of first battery cell 114 with prior impedance data for first battery cell 114, e.g., one or more impedance values determined in the previous tests. This comparison may be used as a part of determining (block 270) the first operating mode for first battery cell 114 (e.g., the first operating mode is determined based on the trend in the impedance data) or as a standalone operation.

In some examples, method 230 further comprises determining (block 272) a second operating mode for second battery cell 124. Similar to the first operating mode, the second operating mode may be determined based on the impedance of the second battery cell 124. However, the second operating mode is also determined based on the first operating mode to ensure that the pack power output is not impacted by switching first battery cell 114 to the first operating mode. Switching back from testing profiles to operating modes may be referred to as bringing cells back online.

In some examples, method 230 further comprises operating (block 280) first battery cell 114 according to the first operating mode. In more specific examples, operating first battery cell 114 according to the first operating mode comprises disconnecting first battery cell 114 if the impedance of first battery cell 114 exceeds a set threshold. Similarly, method 230 further comprises operating (block 282) second battery cell 124 according to the second operating mode.

Various operations of method 230 may be repeated as shown by decision block 290. For example, all cells in a battery pack may be tested in a sequence of tests. In some examples, method 230 comprises setting a timeframe for a new in-situ impedance spectroscopy analysis (e.g., retesting) of first battery cell 114 based on the impedance of first battery cell 114 (e.g., results of the previous test). In some examples, the initial impedance testing is performed when first battery cell 114 is at a first state, (e.g., the signal is applied to first battery cell 114 when first battery cell 114 is at that first state). The in-situ impedance spectroscopy analysis of first battery cell 114 is repeated when first battery cell 114 is at a second state, different from the first state. The first state and the second state are represented by one of the temperature of first battery cell 114, the SOC of first battery cell 114, or the prior operation history of first battery cell 114.

Figure 5A:
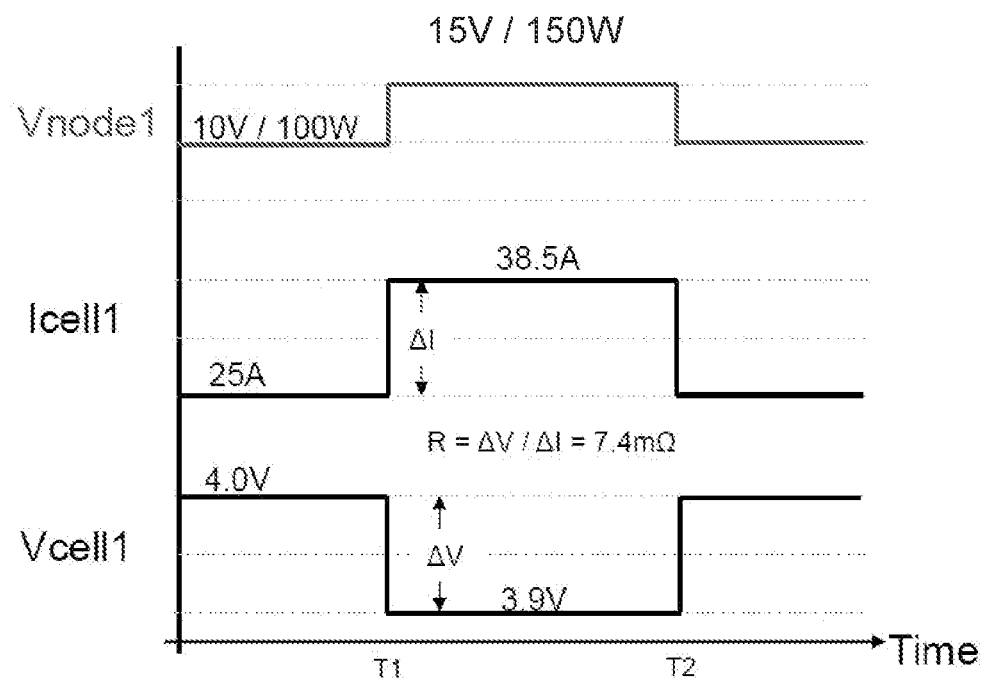
FIGS. 5A and 5B are examples of a node voltage profile and corresponding cell voltage and cell current profiles.
Figure 5B:
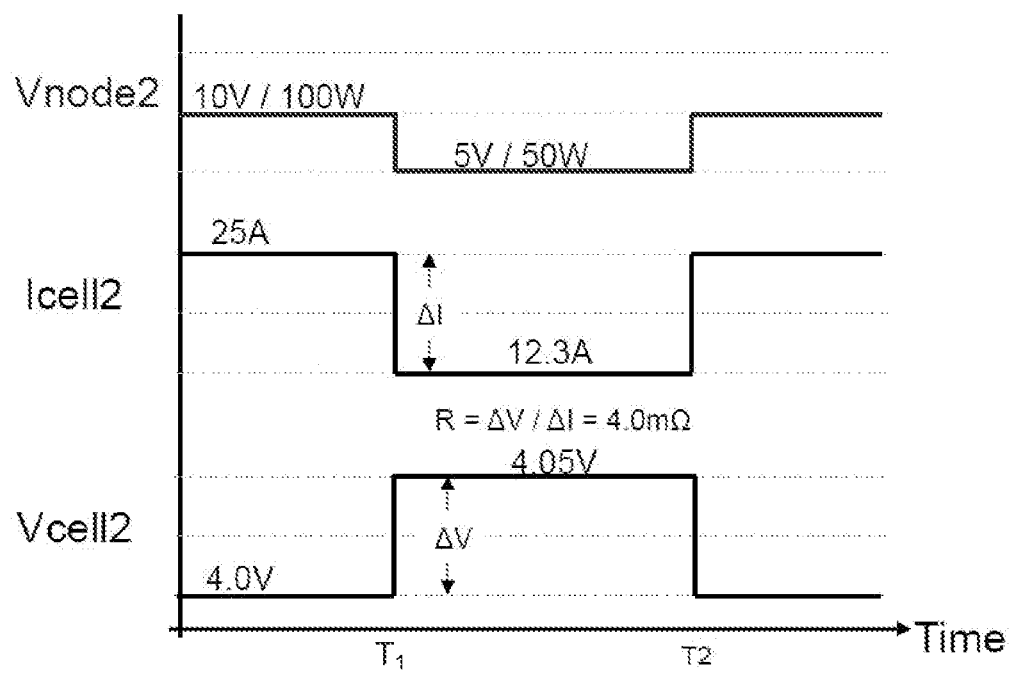

A few more specific examples will now be described to provide a better understanding of various features of this disclosure. FIGS. 5A and 5B illustrate an example of a step profile used for impedance testing. In this example, the pack power output is 200 W, provided by the pack current of 10 A and the pack voltage of 20V. These and other numbers presented below are for illustrative purposes only. The battery pack includes two nodes, such that FIG. 5A represents the first node and FIG. 5b represents the second node. Initially (before T1), both nodes operate in the same manner, each contributing 100 W of power at a voltage of 10V. It should be noted that the two nodes are interconnected in series and the pack current of 10 A is the same as each node current. Therefore, the node voltage is 10V, while the node current is 10 A at each of the two nodes.

From the cell level, the cell current and voltage are different from the node current and voltage due to a node controller functionally separating the cell from the bus. Initially, the first operated at a voltage of 4V with 25 A passing through the cell, thereby producing 100 W (power losses at the node controller are ignored). The second cell operates similarly.

At T1, the voltage of the first node is increased to 15V, which brings the power contribution of this node to 150 W. The current drawn from the first cell is now 38.5 A, which causes the voltage to drop to 3.9V, resulting in roughly the same 150 W. This change in the cell current and voltage may be used to determine the impedance of the first cell.

Furthermore, also at T1, the voltage of the second node is decreased to 5V, which brings the power contribution of this node to 50 W. The current drawn from the second cell is now 12.3 A, which causes the voltage to increase to 4.05V, resulting in roughly the same 50 W. This change in the cell current and voltage may also be used to determine the impedance of the second cell. At T2, both cells and nodes are returning to the original state (pre-T1). For example, the duration of the test may be determined by several clock cycles of a telemetry system. For example, a DC-impedance may be quantified after a current step response with the duration of between 0.5 seconds and 10 minutes or, more specifically, between 2 seconds and 2 minutes, or between 10 seconds and 1 minute (e.g., 1 second, 10 seconds, or 30 seconds).

Figure 6A:
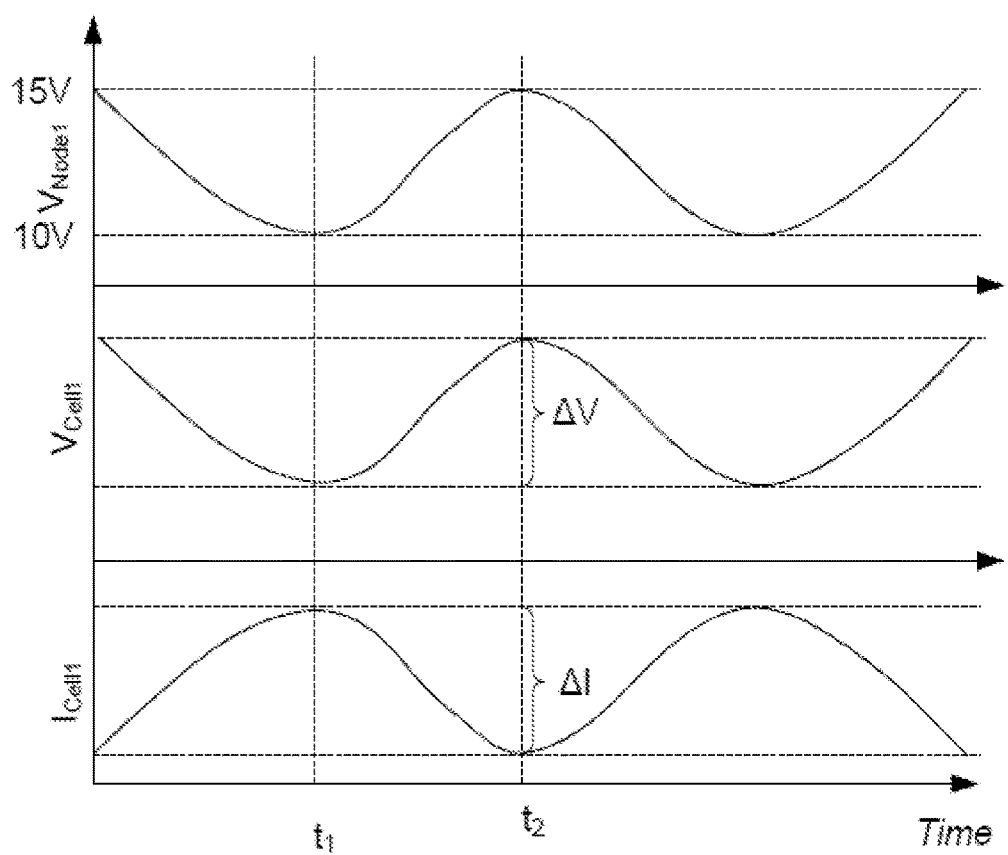
FIGS. 6A and 6B are examples of a node voltage profile and corresponding cell voltage and cell current profiles.
Figure 6B:
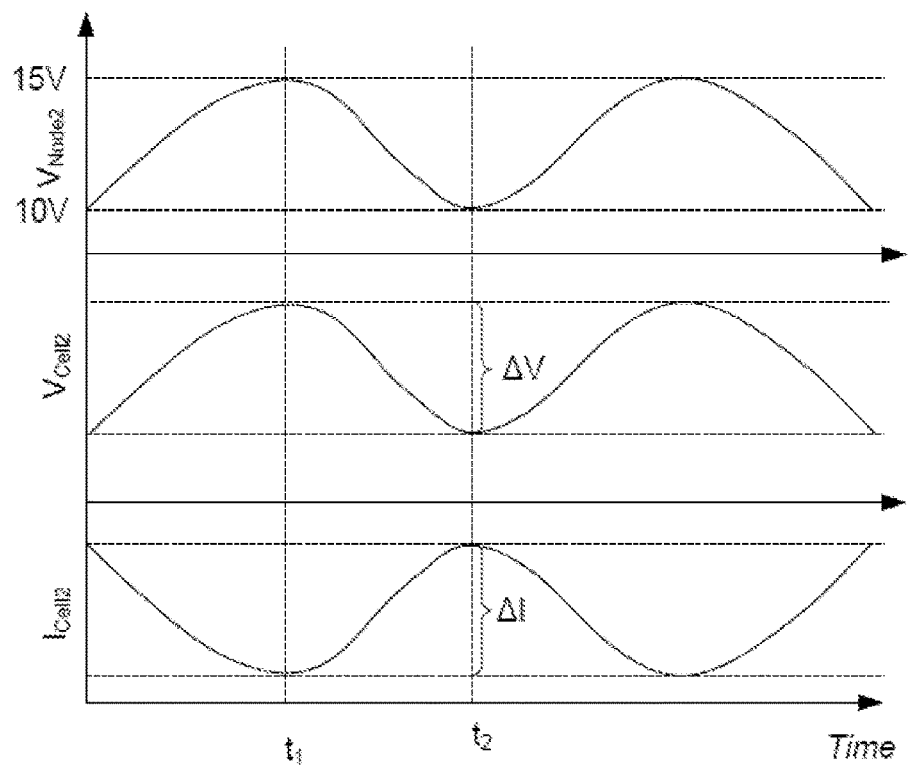

FIGS. 6A and 6B illustrate an example of a sinusoidal test profile. In this example, the voltage and the power output of both nodes are constantly varied over time, following roughly a sinusoidal wave. Specifically, the node voltage is varied between 10V and 15V. To keep the pack power output constant, the first node voltage profile is a mirror image of the second node voltage profile, i.e., complementary sine waves at a specific frequency. The pack and node currents are the same and remain constant, e.g., 10 A. The cell current and voltages are varied accordingly. These dynamic changes in the cell current and voltages are used to determine the impedance frequency characteristics. More complex loading profiles can be used to better characterize the impedance (frequency or time domain shaped stimulus). For example, frequency-domain sweeps, time-domain sweeps, model parameter identification stimuli, and/or degradation-mode identification stimuli may be used.

Figure 7A:
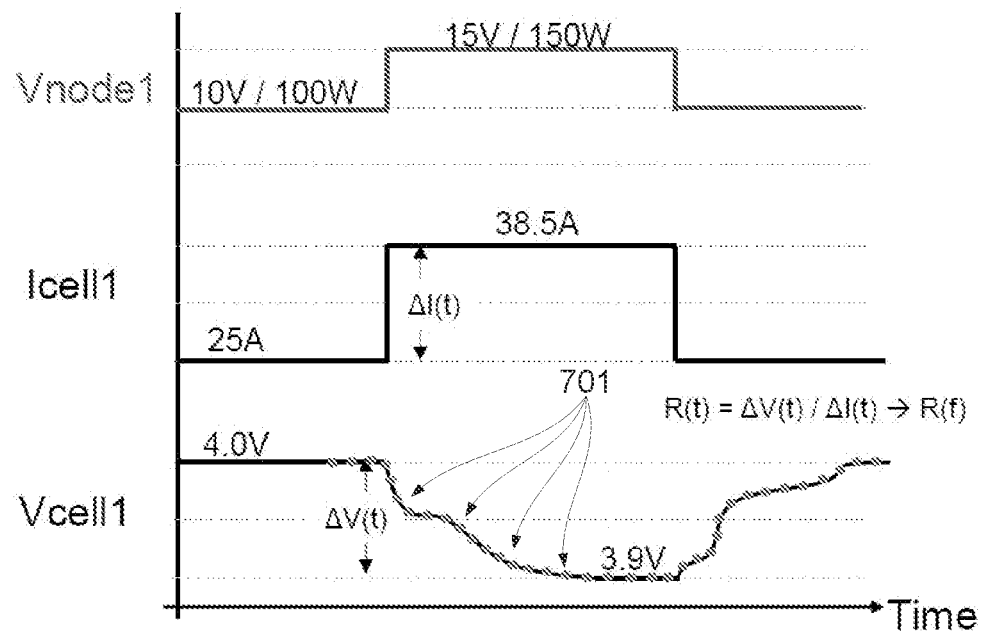
FIGS. 7A and 7B are examples of a node voltage profile and corresponding cell voltage and cell current profiles.
Figure 7B:
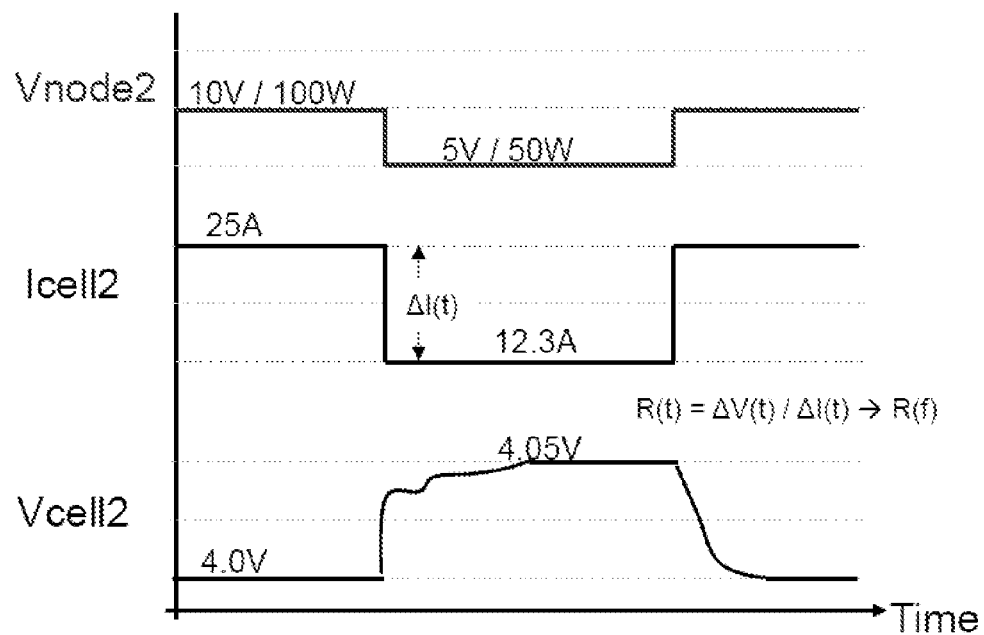

FIGS. 7A and 7B illustrate another example of a test profile, which represents a step response, corresponding to a one-off pulse. The voltage response, if sampled fast enough, yields information at multiple frequencies (e.g., Fourier decomposition). In some cases, controlling the load profile at high frequencies may be difficult, e.g., due to the communication bandwidth limits, accuracy of the outputs at high frequencies, restrictions on the noise injected into the bus, and others. If high-frequency measurement capability is available, then a low-frequency load stimulus, such as a step is used to trigger changes at the cell level. The measured response from the cell over time is used to determine the impedance across a frequency range. For each measured value (dots 701 in FIG. 7A) representing the cell voltage characteristic versus time in response to a load change, similar measurements can be made on other voltages and currents. The time response can be analyzed for frequency behavior (e.g., Laplace or Fourier Transforms) to determine impedance over a range of frequencies.

Figure 9:
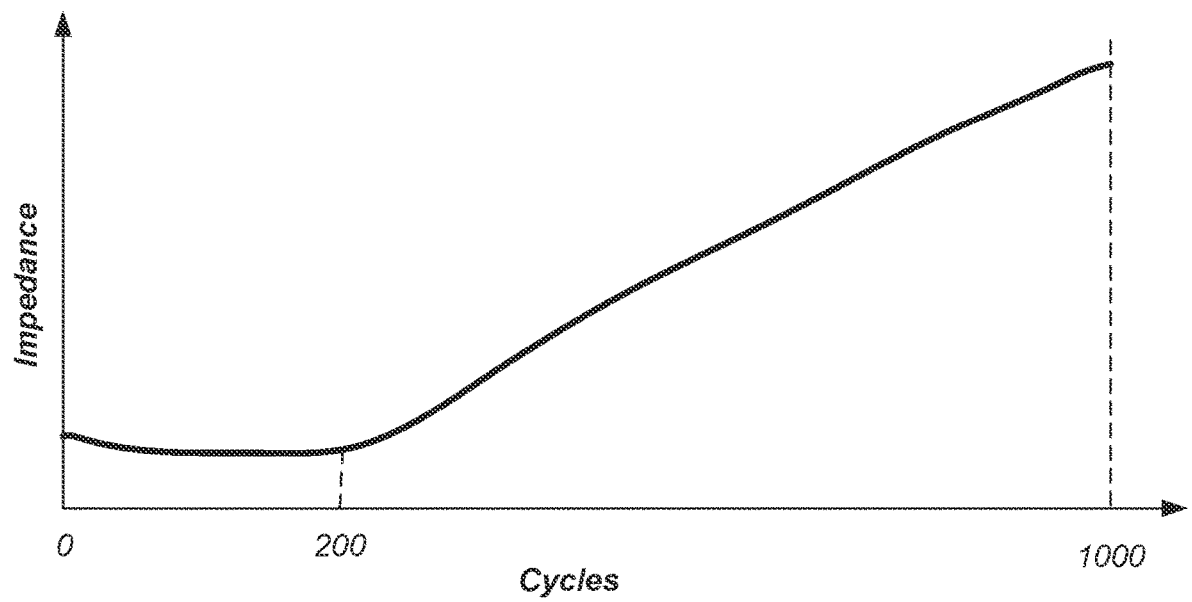
FIG. 9 is a schematic plot of impedance as a function of the cycle life.

In some examples, the determined impedance is used as a part of the state-of-health (SOH) assessment toolkit. Specifically, cell impedance increases over time and/or with cycle count as a result of various internal degradation mechanisms, such as passivation layer buildup, electrolyte oxidation/reduction (e.g., drying up of the cell, reduction of the active surface area), loss of active material by passivation, dissolution, delamination, and others. FIG. 9 is a schematic plot of impedance as a function of charge-discharge cycles performed on the cell. The impedance increases steadily from 200 cycles onwards. As such, using the impedance value, it becomes possible to decompose the loss of useable capacity into two contributions: (1) power fade due to impedance growth (e.g., due to the changes in electrode active materials), and (2) thermodynamic capacity fade (e.g., due to loss of ions available for cycling/irreversible ion trapping).

In some examples, the impedance is used to perform a state-of-power (SOP) assessment or even SOP forecasting. For example, a typical battery cell (e.g., a lithium-ion cell) can be modeled as an equivalent electrical circuit with several passive elements (R, RC), meant to represent different contributions to the cell's impedance. State-of-power is forecasted by simulating the cell model ahead of the current values, associated with these elements. In comparison to traditional models, the described methods and systems allow recalibrating parameters of a model, in near real-time, using the total impedance measurement.

In some examples, the impedance is used to perform a state-of-safety (SOS), such as detecting loose or corroded electrical connections. An abnormal connection will result in a higher Ohmic resistance, leading to much higher heat generation when an electrical current flows through the node. This heat generation can potentially cause locally elevated temperature (a hotspot), which can propagate to the cell, e.g., through thermal conduction via the current collector. Such events are highly undesirable.

In some examples, the impedance is used to perform a state of charge (SOC) assessment. FIG. 8 shows one correlation example between the SOC and the impedance. This correlation may be presented in the form of a look-up table or some other form. Furthermore, the impedance-based SOC assessment may be supplemented or may be used to supplement other types of SOC assessments. Finally, the impedance values may be used for developing an SOC assessment model using, e.g., machine learning.

Further Examples

Further, the description includes examples according to the following clauses:

Clause 1. A method 230 for an in-situ impedance spectroscopy analysis of battery cells in a battery pack 100, the method 230 comprising:
applying a signal to a first battery cell 114 of a first battery node 110 of the battery pack 100 while the battery pack 100 remains operational and provides power output; and
determining an impedance of the first battery cell 114 based on a response of the first battery cell 114 to the signal applied to the first battery cell 114.

Clause 2. The method 230 of clause 1, wherein applying the signal to the first battery cell 114 comprises changing an electrical current through the first battery cell 114.

Clause 3. The method 230 of clause 2, wherein changing the electrical current through the first battery cell 114 is performed in accordance with one of a linear profile, a sinusoidal profile, or a step profile.

Clause 4. The method 230 of any one of clauses 2-3, wherein the response of the first battery cell 114 to changing the electrical current through the first battery cell 114 is a voltage response.

Clause 5. The method 230 of any one of clauses 2-4, wherein the first battery cell 114 is connected to a first node controller 112, wherein the first node controller 112 is further connected in series or parallel with one or more additional node controllers of the battery pack 100, and wherein changing the electrical current through the first battery cell 114 is performed using the first node controller 112.

Clause 6. The method 200 of clause 5, wherein changing the electrical current through the first battery cell 114 is performed using a power converter of the first node controller 112.

Clause 7. The method 200 of any one of clauses 2-6, wherein changing the electrical current through the first battery cell 114 comprises changing the electrical current through another battery cell of the first battery node 110, connected in series with the first battery cell 114.

Clause 8. The method 230 of any one of clauses 1-7, wherein applying the signal to the first battery cell 114 is performed such that a voltage of the battery pack 100 remains unchanged due to power compensation provided by one or more other battery cells in the battery pack 100.

Clause 9. The method 230 of clause 8, further comprising determining an impedance of the one or more other battery cells, providing the power compensation.

Clause 10. The method 200 of any one of clauses 8-9, wherein the power compensation comprises applying a second signal to the one or more other battery cells, wherein the second signal is complementary to the signal applied to the first battery cell 114.

Clause 11. The method 200 of any one of clauses 8-10, wherein at least one of the one or more other battery cells, providing the power compensation, is a part of the first battery node 110.

Clause 12. The method 200 of clause any one of clauses 8-11, wherein at least one of the one or more other battery cells, providing the power compensation, is a part of a second battery node 120, connected in series with the first battery node 110.

Clause 13. The method 200 of any one of clauses 8-12, wherein the power compensation, provided by the one or more other battery cells in the battery pack 100, dynamically changes while applying the signal to the first battery cell 114.

Clause 14. The method 200 of any one of clauses 8-13, wherein the power compensation is determined by a battery pack controller 150, communicatively coupled to the first battery node 110 and remaining nodes of the battery pack 100.

Clause 15. The method 230 of any one of clauses 1-14, wherein applying the signal to the first battery cell 114 is performed while at least one other battery cell of the battery pack 100 continues to charge or discharge, contributing to the power output of the battery pack 100.

Clause 16. The method 230 of any one of clauses 1-15, wherein applying the signal to the first battery cell 114 is performed when a state of charge SOC of the first battery cell 114 is within a predetermined range.

Clause 17. The method 230 of any one of clauses 1-16, wherein applying the signal to the first battery cell 114 is performed when a temperature of the first battery cell 114 is within a predetermined range.

Clause 18. The method 230 of any one of clauses 1-17, wherein applying the signal to the first battery cell 114 is triggered by a battery pack controller 150, communicatively coupled to a first node controller 112, which controls electrical connections to the first battery cell 114.

Clause 19. The method 230 of any one of clauses 1-18, wherein applying the signal to the first battery cell 114 is triggered based on at least one of operating history of the first battery cell 114, operating history of the battery pack 100, testing history of the first battery cell 114, testing history of the battery pack 100, SOC of the first battery cell 114, SOC of the battery pack 100, temperature of the first battery cell 114, OCV of the first battery cell 114, voltage of the first battery cell 114 under a set load, or test data analysis of battery cells equivalent to the first battery cell 114.

Clause 20. The method 230 of any one of clauses 1-19, further comprising determining new operating parameters for the first battery cell 114, based on the impedance of the first battery cell 114 and operating the first battery cell 114 based on the new operating parameters.

Clause 21. The method 230 of any one of clauses 1-20, further comprising disconnecting the first battery cell 114 if the impedance of the first battery cell 114 exceeds a set threshold.

Clause 22. The method 230 of any one of clauses 1-21, further comprising setting a timeframe for a new in-situ impedance spectroscopy analysis of the first battery cell 114 based on the impedance of the first battery cell 114.

Clause 23. The method 230 of any one of clauses 1-22, further comprising comparing the impedance of the first battery cell 114 with prior impedance data for the first battery cell 114.

Clause 24. The method 230 of any one of clauses 1-23, further comprising determining one or more degradation modes of the first battery cell 114 based on at least the impedance of the first battery cell 114.

Clause 25. The method 230 of any one of clauses 1-24, further comprising transmitting data representing the impedance of the first battery cell 114 from the battery pack 100 to a battery data system 102, communicatively coupled to the battery pack 100.

Clause 26. The method 230 of clause 25, further comprising aggregating the data representing the impedance of the first battery cell 114 with additional impedance data, forming at least a portion of aggregate battery data.

Clause 27. The method 230 of clause 26, wherein the additional impedance data is received by the battery data system 102 from a fleet of power systems comprising additional battery packs, equivalent to the battery pack 100.

Clause 28. The method 230 of clause 25, further comprising receiving, at the battery pack 100 and from the battery data system 102, one or more of an in-situ impedance spectroscopy analysis protocol, a power compensation protocol, or a cell operating protocol.

Clause 29. The method 230 of any one of clauses 1-28,
wherein the signal is applied to the first battery cell 114 when the first battery cell 114 is at a first state,
wherein the in-situ impedance spectroscopy analysis of the first battery cell 114 is repeated when the first battery cell 114 is at a second state, different from the first state, and
wherein the first state and the second state are represented by one of temperature of the first battery cell 114, SOC of the first battery cell 114, or SOH of the first battery cell 114.

Clause 30. The method 230 of any one of clauses 1-29, further comprising:
obtaining one or more temperature readings of the first battery cell 114 while applying the signal to the first battery cell 114; and
correlating the one or more temperature readings to the impedance of the first battery cell 114.

Clause 31. The method 230 of any one of clauses 1-30, further comprising, before applying the signal to the first battery cell 114, determining the signal based on one or more characteristics of the first battery cell 114.

Clause 32. A cell battery pack 100 comprising:
a first battery node 110, comprising a first node controller 112 and a first battery cell 114, electrically coupled to the first node controller 112, wherein the first node controller 112 is configured to apply a signal to the first battery cell 114 while the battery pack 100 remains operational and providing power output;
a second battery node 120, comprising a second node controller 122 and a second battery cell 124, electrically coupled to the second node controller 122,
a bus 140, electrically interconnecting the first node controller 112 and the second node controller 122; and
a battery pack controller 150, communicatively coupled to the first node controller 112 and the second node controller 122, wherein at least one of the first node controller 112 or the battery pack controller 150 is configured to determine an impedance of the first battery cell 114 based on a response of the first battery cell 114 to the signal applied to the first battery cell 114.

Clause 33. The battery pack 100 of clause 32, wherein the battery pack controller 150 is configured to maintain a voltage of the battery pack 100 substantially unchanged while applying the signal to the first battery cell 114.

Clause 34. The battery pack 100 of any one of clauses 32-33, wherein the first node controller 112 comprises a power converter, configured to step-up or step-down a voltage of the first battery cell 114.

Clause 35. The battery pack 100 of any one of clauses 32-34, wherein the one or more switches are configured to bypass an electrical current through the first battery node 110.

Clause 36. The battery pack 100 of any one of clauses 32-35, wherein the signal, applied to the first battery cell 114, comprises changes to an electrical current through the first battery cell 114.

Clause 37. The battery pack 100 of clause 36, wherein the change in the electrical current through the first battery cell 114 follows one of a linear profile, a sinusoidal profile, or a step profile.

Clause 38. The battery pack 100 of any one of clauses 32-37, wherein the response of the first battery cell 114 to the signal applied to the first battery cell 114 is a voltage response.

CONCLUSION

Although the foregoing concepts have been described in some detail for purposes of clarity of understanding, it will be apparent that certain changes and modifications may be practiced within the scope of the appended clauses. It should be noted that there are many alternative ways of implementing the processes, systems, and apparatus. Accordingly, the present examples are to be considered as illustrative and not restrictive.

What is claimed is:

1. A method for on-demand in-situ analysis of multiple battery nodes comprising a first battery node and one or more additional battery nodes, the method comprising:
   applying a test profile to the first battery node and simultaneously applying a compensation profile to the one or more additional battery nodes, wherein:
   applying the test profile to the first battery node comprises changing an electrical current through the first battery node,
   applying the compensation profile to the one or more additional battery nodes comprises changing an electrical current through the one or more additional battery nodes,
   the test profile is designed to detect one or more characteristics of the first battery node while the test profile is applied to the first battery node,
   the compensation profile compensates for power output changes associated with applying the test profile to the first battery node,
   the first battery node comprises a first plurality of battery cells, a first node controller used for applying the test profile to the first battery node, and a first power converter configured to monitor the one or more characteristics of the first battery node while applying the test profile to the first battery node,
   the first battery node is selected from the multiple battery nodes for purposes of the on-demand in-situ analysis,
   the first node controller is communicatively connected with one or more additional node controllers of the one or more additional battery nodes and configured to determine the test profile for the first battery node and the compensation profile for the one or more additional battery nodes,
   the one or more additional node controllers control operation of the one or more additional battery nodes, and
   the one or more additional battery nodes continue to charge or discharge while applying the test profile to the first battery node; and
   determining the one or more characteristics of the first battery node based on a response of the first battery node to the test profile applied to the first battery node.

2. The method of claim 1, wherein the one or more characteristics of the first battery node comprise impedance of one or more batteries in the first plurality of battery cells.

3. The method of claim 1, wherein changing the electrical current through the first battery node is performed in accordance with one of a linear profile, a sinusoidal profile, or a step profile.

4. The method of claim 3, wherein the first node controller comprises a power converter that changes the electrical current through the first battery node.

5. The method of claim 3, wherein changing the electrical current through the first battery node determines the compensation profile of the one or more additional battery nodes.

6. The method of claim 1, wherein the response of the first battery node is a voltage response.

7. The method of claim 1, wherein the test profile and the compensation profile are selected such that voltage of the multiple battery nodes remains unchanged.

8. The method of claim 1, wherein the multiple battery nodes continue to charge or discharge based on a power demand from multiple battery nodes while applying the test profile to the first battery node and while applying the compensation profile to the one or more additional battery nodes.

9. The method of claim 1, further comprising determining one or more characteristics of the one or more additional battery nodes based on a response of the one or more additional battery nodes to the compensation profile applied to the one or more additional battery nodes.

10. The method of claim 1, wherein the test profile is applied to the first battery node when the first plurality of battery cells has a state of charge (SOC) within a predetermined range.

11. The method of claim 1, wherein the test profile is applied to the first battery node when the first plurality of battery cells has a temperature within a predetermined range.

12. The method of claim 1, wherein applying the test profile to the first battery node is triggered based on at least one of operating history of the first plurality of battery cells, operating history of the multiple battery nodes, testing history of the first plurality of battery cells, testing history of the multiple battery nodes, a state of charge (SOC) of the first plurality of battery cells, a state of charges (SOC) of the multiple battery nodes, temperature of the first plurality of battery cells, an open circuit voltage (OCV) of the first plurality of battery cells, voltage of the first plurality of battery cells under a set load, or test data analysis of battery cells equivalent to the first plurality of battery cells.

13. The method of claim 1, further comprising:
    determining new operating parameters for the first battery node based on the one or more characteristics of the first battery node, and
    operating the first battery node based on the new operating parameters.

14. The method of claim 1, further comprising disconnecting the first battery node if the one or more characteristics of the first battery node exceed a set threshold.

15. The method of claim 1, further comprising determining one or more degradation modes of the first battery node based at least in part on the one or more characteristics of the first battery node.

16. The method of claim 1, wherein:
    applying the test profile to the first battery node is performed when the first battery node is in a first state,
    applying the test profile to the first battery node is repeated when the first battery node is in a second state, and
    the first state and the second state are differentiated by one of temperature of the first plurality of battery cells, a state of charge (SOC) of the first plurality of battery cells, or a state of health (SOH) of the first plurality of battery cells.

17. The method of claim 1, wherein:
    the one or more characteristics comprise one or more impedance values of the first plurality of battery cells and one or more temperature readings of the first plurality of battery cells
    the one or more temperature readings are correlated to the one or more impedance values.

18. The method of claim 1, further comprising determining the test profile based on one or more characteristics of the first plurality of battery cells.

* * * * *